(12) United States Patent
Tell et al.

(10) Patent No.: US 11,133,794 B1
(45) Date of Patent: Sep. 28, 2021

(54) SIGNAL CALIBRATION CIRCUIT

(71) Applicant: NVIDIA Corp., Santa Clara, CA (US)

(72) Inventors: Stephen G Tell, Chapel Hill, NC (US); Matthew Rudolph Fojtik, Chapel Hill, NC (US); John Poulton, Chapel Hill, NC (US)

(73) Assignee: NVIDIA Corp., Santa Clara, CA (US)

( * ) Notice: Subject to any disclaimer, the term of this patent is extended or adjusted under 35 U.S.C. 154(b) by 0 days.

(21) Appl. No.: 17/020,556

(22) Filed: Sep. 14, 2020

(51) Int. Cl.
*H03K 5/14* (2014.01)
*G04F 10/00* (2006.01)

(52) U.S. Cl.
CPC ............. *H03K 5/14* (2013.01); *G04F 10/005* (2013.01)

(58) Field of Classification Search
CPC ................................ H03K 5/14; G04F 10/005
USPC .................................................. 327/142, 143
See application file for complete search history.

(56) References Cited

U.S. PATENT DOCUMENTS

| | | | |
|---|---|---|---|
| 4,811,364 A | 3/1989 | Sager et al. | |
| 5,004,933 A | 4/1991 | Widener | |
| 6,108,794 A | 8/2000 | Erickson | |
| 6,137,851 A | 10/2000 | Erickson et al. | |
| 6,239,629 B1 * | 5/2001 | Erickson | H03L 7/0814 326/93 |
| 6,879,650 B1 | 4/2005 | Villarosa, Jr. et al. | |
| 7,958,382 B2 * | 6/2011 | Kim | G11C 7/22 713/500 |
| 9,774,329 B2 | 9/2017 | Mäkipää et al. | |
| 9,864,720 B2 * | 1/2018 | Chae | G06F 13/4243 |
| 2011/0208988 A1 | 8/2011 | Kim et al. | |
| 2012/0119800 A1 * | 5/2012 | Yamasaki | H03L 7/183 327/142 |
| 2016/0056825 A1 * | 2/2016 | Vlachogiannakis | H03M 1/201 327/142 |
| 2019/0064329 A1 * | 2/2019 | Liu | H03K 3/037 |

OTHER PUBLICATIONS

Machado, Cabral, Alves, "All-Digital Time-to-Digital Converter Design Methodology Based on Structured Data Paths", Aug. 9, 2019, p. 108448, vol. 7, IEEE Access.
Semait, Ginosar, Timing Measurements of Synchronization Circuits, Technion—Israel Institute of Technology, Feb. 2003. https://webee.technion.ac.il/~ran/papers/SemiatGinosar-TimingMeasurements-Feb03.pdf.

* cited by examiner

*Primary Examiner* — Tomi Skibinski
(74) *Attorney, Agent, or Firm* — Rowan TELS LLC

(57) ABSTRACT

This disclosure relates to a circuit comprising a first, second, and third data latch, and an input for a data signal. The first data latch may be configured to sample a delayed version of the data signal in response to a first control signal. The second data latch may be configured to sample the delayed version of the data signal in response to a run clock signal. The run clock signal may be configured to run for a predefined number of clock cycles subsequent to the first control signal. The third data latch may be configured to sample either an output signal of the first data latch or an output signal of the second data latch in response to a second control signal received after the predefined number of clock cycles of the run clock signal.

21 Claims, 12 Drawing Sheets

SIGNAL CALIBRATION CIRCUIT

BACKGROUND

Time-to-Digital Converters (TDCs) are used to evaluate timing margin in dynamically clocked systems. In these systems, the clock period may be intentionally varied as a function of the power supply, such that when the power supply droops, clock period increases. Conversely, when the power supply voltage increases, the clock period decreases. Because the speed of digital logic also varies with the power supply, decreasing at lower voltages, the system operation adapts to power supply variations.

In practice, matching the clock period response to power supply behavior with the timing requirements of logic paths involves careful tuning of the clock generator. If the clock period is too long, then time (and therefore potential system performance) may be wasted. If the clock period is too short, logic may not have completed sensing and response operations by the time the next clock edge arrives, resulting in improper operation.

TDCs may be used to monitor the relative speed of certain logic paths with respect to the clock period to adjust clock generator trim settings and to help ensure that logic paths have sufficient, but not excessive, margin. The typical TDC may comprise delay lines and sampling flip flops, arranged such that an edge traveling down the delay line is sampled at the various times.

However, the large number of flip flops utilized to synchronize all of the TDC samples takes substantial chip area, and clocking all of these flip flops consumes significant power. The large number of flip flops are needed to account for inherent metastability of conventional flip flop circuits. The number of flip flops needed to reliably synchronize each bit of potentially metastable TDC output increases as the clock period decreases.

Flip flops may be used on a data line that includes delay components in order to take samples of the signal at different points. The first flip flop may at times enter a metastable state, such that conventional solutions cascade additional flip flops off of the first ones. Flip flops may be cascaded thus two or three times, each cascaded row of flip flops being referred to as a "stage." Conventionally, as many as three TDC stages are used, but four stages is expected in the future. Thus, conventional solutions take too much space (silicon area) and use too much power, and a more space- and power-saving solution is desirable.

BRIEF SUMMARY

This disclosure relates to a circuit comprising a first, second, and third data latch, and an input for a data signal. The data signal may comprise an edge (either a rising edge or a falling edge) traveling down a signal line, such as a delay line. The first data latch may be configured to sample a delayed version of the data signal in response to a first control signal. The second data latch may be configured to sample the delayed version of the data signal in response to a run clock signal. The run clock signal may be configured to run for a predefined number of clock cycles subsequent to the first control signal. The third data latch may be configured to sample either an output signal of the first data latch or an output signal of the second data latch in response to a second control signal received after the predefined number of clock cycles of the run clock signal.

This disclosure further relates to a circuit comprising a first and second D flip flop, an input for a data signal, and XOR gate, and an SR NOR latch. The first D flip flop may be configured to sample a delayed version of the data signal in response to an initialization clock signal. The second D flip flop may be configured to sample the delayed version of the data signal in response to a run clock signal configured to run for sampling period. The run clock signal may be synchronized with the initialization clock signal. The XOR gate may be configured to detect a change in an output signal for the first D flip flop or an output signal of the second D flip flop in response to the run clock signal. The SR NOR latch may be configured to receive an output signal from the XOR gate and store the change in either the output signal of the first D flip flop or the output signal of the second D flip flop.

This disclosure relates to a circuit comprising first, second, third, and fourth sampling circuits and a delay line. The first sampling circuit may be connected to the delay line. The second sampling circuit may be connected to the delay line and a run clock signal. The first sampling circuit and the second sampling circuit may each be configured to register a rising edge of a data signal on the delay line. The third sampling circuit may be connected to the first sampling circuit and the second sampling circuit. The third sampling circuit may be configured to store a high logic level when the first sampling circuit and the second sampling circuit each output different logic levels. The fourth sampling circuit may be connected to the third sampling circuit and may be configured to determine an output signal of the third sampling circuit in response to a third control signal.

Finally, this disclosure relates to a system comprising a clock signal, a delay line, a driver, a plurality of buffer circuits, an encoder, and a controller. The delay line may be configured to carry a data signal. The delay line may comprise a set of nodes separated by delay components. The driver may be configured to send the data signal on the delay line for a sampling period in response to a change in the clock signal. The plurality of buffer circuits may each be connected to one node of the set of nodes. Each buffer circuit may be configured to output a binary value for one digit of a thermometer code. The encoder may be configured to receive the thermometer code from the plurality of buffer circuits and convert the thermometer code to a binary code. The controller may be configured to determine jitter within the data signal based on the binary code.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
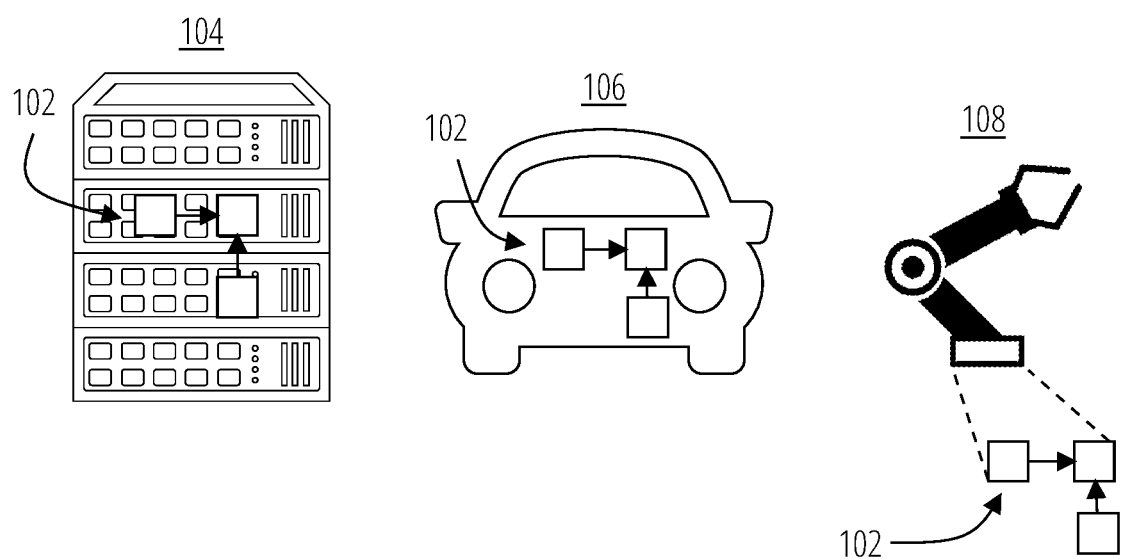
FIG. 1 depicts a circuit system 102 in accordance with one embodiment.

Described is an independent metastability-tolerant circuit. The embodiments of the independent metastability-tolerant circuit may be used in a time-to-digital converter that produces a minimum, a maximum, and/or both a minimum and maximum summary of the variation in relationship between a data delay and a clock period. By accumulating "value changed" bits in an independent metastability-tolerant circuit for each sample, then waiting for any remaining metastability to resolve, this converter avoids the expense of a large number of synchronizing flops for each sample.

"Clock" refers to any hardware, software, firmware, circuit, electronic component, module, logic, device, or apparatus configured, programmed, designed, arranged, or engineered to supply a clock signal for two or more circuits or electronic components.

"Clock signal" refers to an electronic signal configured to periodically oscillate from a high level to a low level with a certain frequency. "Control signal" refers to an electrical signal (analog or digital, sent by wire or wireless) sent from one device, component, manager, or controller to another device, component, manager, or controller configured to act in response to the control signal.

"Controller" refers to a hardware, device, component, element, circuitry, logic, or circuit configured to manage and control operation of another software, hardware, firmware, system, sub-system, device, apparatus, or logic unit, component, device, or component.

Two flip flops (data latches) may be used in one embodiment. The first takes a first sample and the second is connected to a run clock signal. Each time the clock has a rising edge, the second flip flop may sample the data delay line. Logic may be included such that the resulting signal may be buffered and may flip state if the output of the clocked flip flop changes due to metastability of the clocked flip flop. The overall output may be buffered until after a resolution time period has passed.

"Flip flop" refers to an electronic component or circuit configured to store a binary value based on one or more input signals. A flip flop may be gated or clocked, and such flip flops may also be referred to as a synchronous flip flop or a clocked set/reset (SR) latch. Thus herein, it will be understood that latches may be used in some places where flip-flops are indicated, and vice versa.

"Data latch" refers to a latch or any electronic device, circuit, component, or element configured, programmed, designed, arranged, or engineered to store a data value, such as a binary '1' or a binary '0. "Latch" refers to any circuit, sub-circuit, electronic component, hardware, software, firmware, module, logic, device, or apparatus configured, programmed, designed, arranged, or engineered to store a data value.

In certain embodiments, latches are designed to be transparent, which means that the output of the latch may change immediately in response to a change in an input signal to the latch. In other embodiments, latches are not transparent and output of the latch changes only in response to a change in an input clock signal connected to the latch. Examples of a latch include, but are not limited to an SR NAND Latch, an SR NOR Latch, a D latch, a flip flop, a D flip flop, a JK flip flop, a half flip flop, and the like.

"SR latch" refers to a latch having a first output Q and second output not Q (complement of Q). The SR latch has first input, S, that sets a bit value stored in the SR latch to a binary '1' and a second input, R, that resets a bit value stored in the SR latch to a binary '0.' "SR NAND Latch" refers to an SR latch implemented by cross-coupled NAND gates. An SR NAND latch may have Not S and Not R as inputs. "SR NOR Latch" refers to an SR latch implemented by cross-coupled NOR gates. An SR NOR latch may have S and R as inputs.

FIG. 1 depicts exemplary scenarios for use of a circuit system 102 in accordance with some embodiments. A circuit system 102 may be utilized in a computing system 104, a vehicle 106, and a robot 108, to name just a few examples. The circuit system 102 may comprise a digital circuit receiving inputs from a clock circuit and a power supply, for example.

Figure 2:
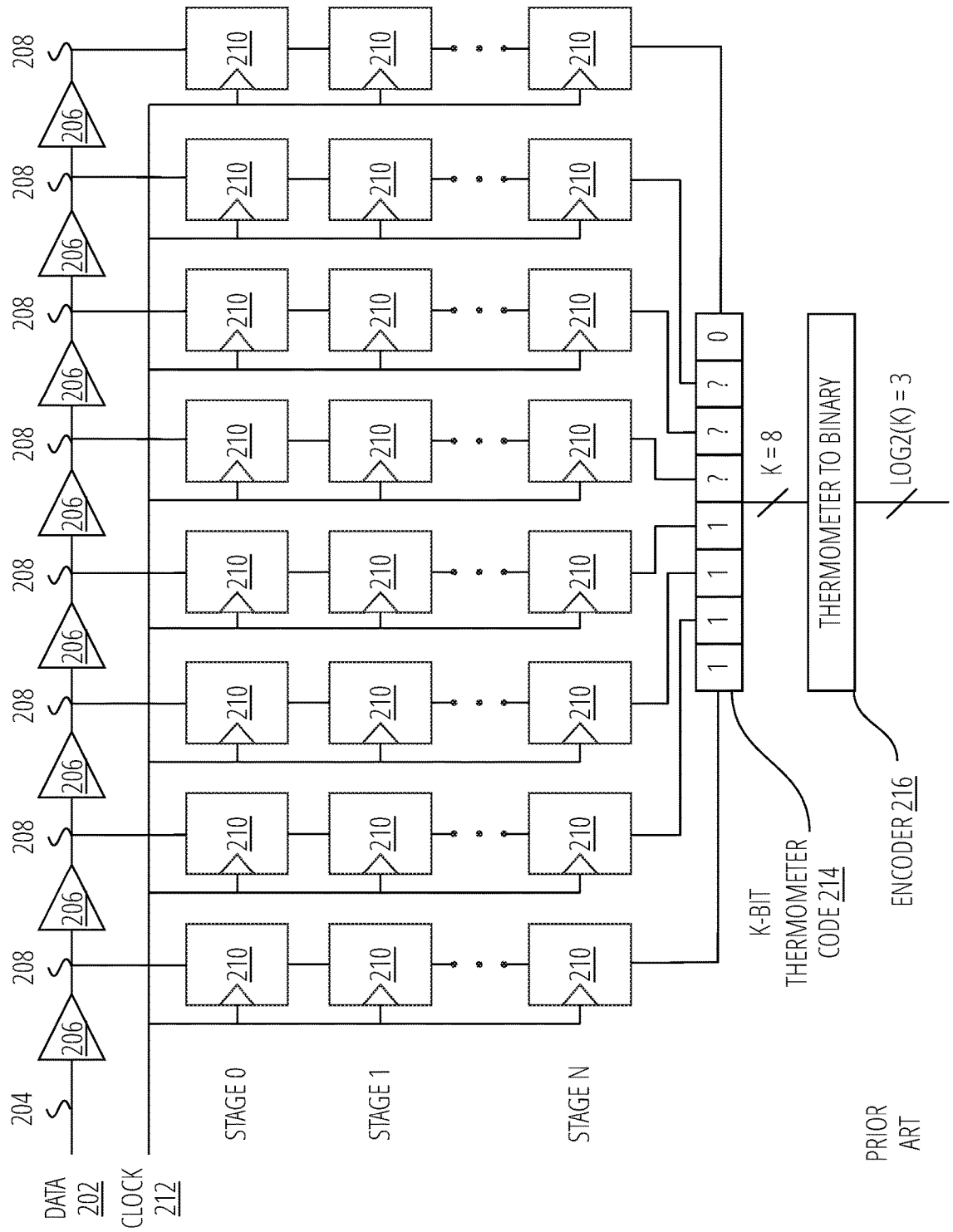
FIG. 2 depicts a circuit diagram of a conventional Time-to-Digital Converter (TDC).

FIG. 2 depicts a circuit diagram of a conventional Time-to-Digital Converter (TDC). This TDC comprises a data signal 202, a delay line 204, delay components 206, nodes 208, flip flops 210, a clock signal 212, a thermometer code 214, and an encoder 216.

An edge of the data signal 202 traveling down the delay line 204 is sampled after propagating through a number of delay components 206. The delay components 206 separate the delay line 204 into nodes 208 at which delayed versions of the signal may be sampled.

"Delay line" refers to a portion of a circuit line configured to convey a signal. The delay line includes one or more delay components.

"Delay component" refers to an electronic component configured to introduce a propagation delay to a signal, such as a data signal. Delay components may be buffers, chained inverters, or some other device providing a delay in a signal propagating from the delay component input to the delay component output. In certain embodiments, the delay component may provide a consistent delay to a signal passing through the delay component. In other embodiments, the delay component may be configured to not interfere with a predictable delay influenced by one or more conditions (e.g., voltage, temperature, component age, or the like). In certain embodiments, such a predictable delay may be a change that a circuit in accordance with one of the disclosed embodiments, is configured to detect and/or count or track. "Node" refers to a point of connection between two components or a circuit.

A rising edge may be propagated as the data signal 202. Samplers (flip flops 210) on the left in the depiction of FIG. 2 may capture/sense/register a '1', since the edge has passed them at the sampling time. Samplers (flip flops 210) on the right in the depicted circuit capture a '0.' Samplers may be implemented using flip flops 210 as depicted and may also be implemented using other types of latching logic.

The behavior of the data signal relative to the clock signal can be tracked and observed using the thermometer code 214. As an edge, such as a rising edge, passes through the circuit, bits of the thermometer code 214 change from '0' to '1.' The point of this transitions is referred to herein as a boundary or sample boundary. In the depicted example, the thermometer code 214 includes '?'s between the '1's and the '0's, these'?'s represent the boundary and the '?' represent bits that are not sensed clearly as a '1' or a '0.' The '?' bits represent metastability caused by metastable electronic components of the flip flops 210 between a node 208 and the thermometer code 214 bit position.

If the time between edges becomes shorter, the boundary between '1' samples and '0' samples moves to the left. If the time between edges becomes longer, the boundary moves to the right. Similarly, if the clock signal 212 changes, the boundary between '1' samples and 0 samples also shifts. A longer clock period moves the boundary to the right, and a shorter clock period moves the boundary to the left.

If the clock signal 212 period and the data signal edges track each other, the resulting sample boundary does not move, even when both the delay time and the clock period change. This is the condition the clock generator is desired to meet in responding, for example, to power supply behavior changes. This conventional TDC takes many samples and synchronizes each sample using a chain of flip flops 210 (Stage 0 through Stage 2 in this figure) to ensure that stable values, and not indeterminate or metastable values, are fed to downstream logic. "Metastable" refers to a characteristic of an electronic sampling circuit (such as a latch or flip-flop) that when clocked to sample a digital signal that is in the process of changing from a first logic level to a second logic level, the sampling circuit takes a relatively long and unpredictable time before the sampling circuit's output settles to a voltage that represents one of the two digital logic states to any subsequent logic circuit. While the time for the sampling circuit's output to settle is unpredictable, the sampling circuit's output does eventually settle.

The encoder 216 logic converts the "thermometer code" of N ones followed by M zeros, into a binary code, and the takes the minimum and/or maximum value of N over a number of samples. The difference between the minimum and maximum value of N is a measure of mismatch in clock period versus data delay tracking. "Encoder" refers to a circuit, sub-circuit, electronic component, hardware, software, firmware, module, logic, device, or apparatus configured, programmed, designed, arranged, or engineered to convert data in one format or sequence or encoding into another predefined encoding. "Thermometer code" refers to code value expressed in a set of binary digits such that the thermometer code counts up by each successive digit moving from right to left changes from a '0' to a '1' in a similar manner to a thermometer rising to reflect an increase in temperature. Similarly, a thermometer code may count down by each successive digit moving from left to right changes from a '1' to a '0' in a similar manner to a thermometer falling to reflect a decrease in temperature.

Figure 3:
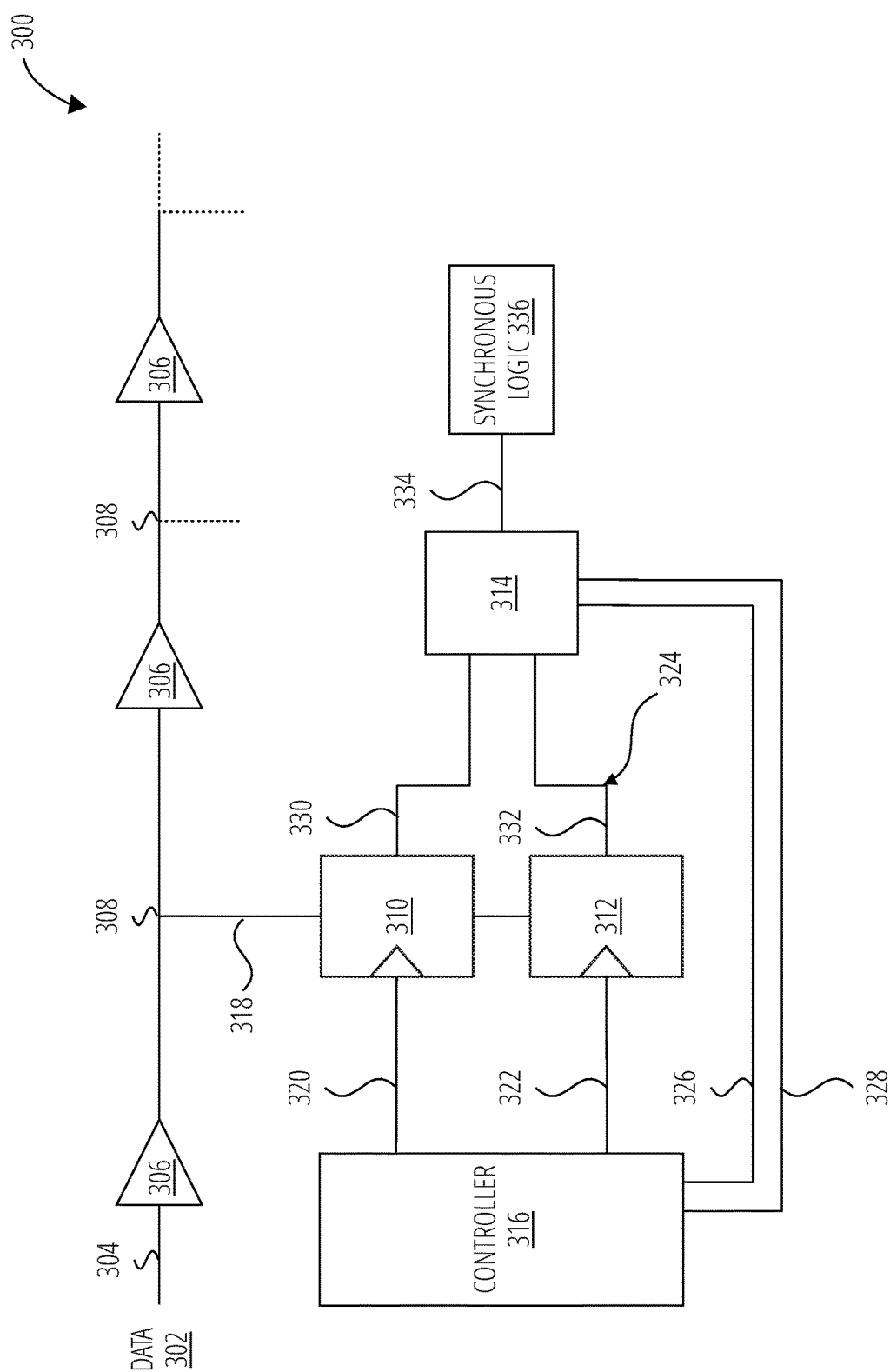
FIG. 3 depicts a circuit 300 in accordance with one embodiment.

FIG. 3 depicts a circuit 300 in accordance with one embodiment. The circuit 300 comprises an input for a data signal 302, a delay line 304, a delay component 306, a node 308, a first data latch 310, a second data latch 312, a third data latch circuit 314, and a controller 316. The data signal 302 may be transmitted across a delay line 304 through a series of delay components 306. Between each delay component 306, a node 308 may provide access to a delayed version 318 of the original data signal 302, similar to the action of the delay line 204 and delay components 206 first introduced in FIG. 2.

The first data latch 310 may be configured to sample a delayed version 318 of the data signal 302 in response to a first control signal 320. The second data latch 312 may be configured to sample the delayed version 318 in response to a run clock signal 322 configured to run for a predefined number of clock cycles subsequent to a pulse on the first control signal 320. "Run clock signal" refers to a clock signal sent during a period of operation of a circuit, sub-circuit, system, device, or apparatus. In certain embodiments, a run clock signal may originate from a system clock and may be controlled by one or more controllers, state machines, or other logic, referred to generally as a controller. The controller may manage when a run clock signal is on and running and when it is off. Herein, the run clock signal may be an activated burst of the circuit clock signal of a configured duration. "Clock cycle" refers to a time between when an oscillator that generates a clock signal changes from providing a high clock signal to a low clock signal or vice versa. A clock cycle is measured between common points on a curve representing the clock cycle, e.g., the rising edge, or falling edge, or the like.

The third data latch circuit 314 may be configured to sample either an output signal 330 for the first data latch 310 or an output signal 332 for the second data latch 312 in response to an initialization signal 326 received after the predefined number of clock cycles of the run clock signal 322. "Initialization signal" refers to a control signal configured to cause an electronic component to transition to an initial state in preparation for performing a feature or function associated with the electronic component. "Output signal" refers to an analog signal or digital signal comprising a voltage level or current level on an output terminal of an electronic component.

In one embodiment, the controller 316 of the circuit 300 may be configured to send the first control signal 320 to the first data latch 310. The controller 316 may send the initialization signal 326 to the third data latch circuit 314 after sending the first control signal 320. The initialization signal 326 may be configured to reset the third data latch circuit 314 such that the third data latch circuit 314 is prepared to register and store one of the output signal 330 and output signal 332. The controller 316 may send the run clock signal 322 to the second data latch 312 for a sampling period. "Sampling period" refers to a period of time during which a sampling operation is performed.

The run clock signal 322 may be simultaneous with, or in sync with, the first control signal 320. The controller 316 may send the second control signal 328 to the third data latch circuit 314 after a resolution time following the sampling period. The second control signal 328 may cause the third data latch circuit 314 to send an output signal 334 to synchronous logic 336 downstream from the circuit 300. "Synchronous logic" refers to electronic components configured to implement logic based on a regular clock signal.

In one embodiment, the third data latch circuit 314 may be configured to receive either a metastable signal or narrow pulse 324 with each clock pulse of the run clock signal 322. "Metastable signal" refers to signal such as a data signal that is metastable, has a metastable characteristic. "Clock pulse" refers to a part of a clock cycle when the clock signal is a high voltage or rising from a low voltage to a high voltage to represent a logic high value. "Narrow pulse" refers to a clock pulse that is shorter than a clock signal is designed to operate. Generally, a narrow pulse may be caused by environmental changes or conditions and/or by external interference.

The third data latch circuit 314 may register a change in the output signal 330 from the first data latch 310 or the output signal 332 from the second data latch 312 over a series of clock pulses of the run clock signal 322. In one embodiment, the first data latch 310 may comprise a D latch. The second data latch 312 may comprise a D flip flop. "D flip flop" or "edge-triggered D flip flop" or "data flip flop"

or "delay flip flop" refers to a flip flop connected to an oscillating signal such as a clock signal on a first input and a data line on a second input. In a D flip flop, the output value changes based on the input signals only when the clock signal is active (either active high or active low). The third data latch circuit 314 may comprise a D latch.

Figure 4:
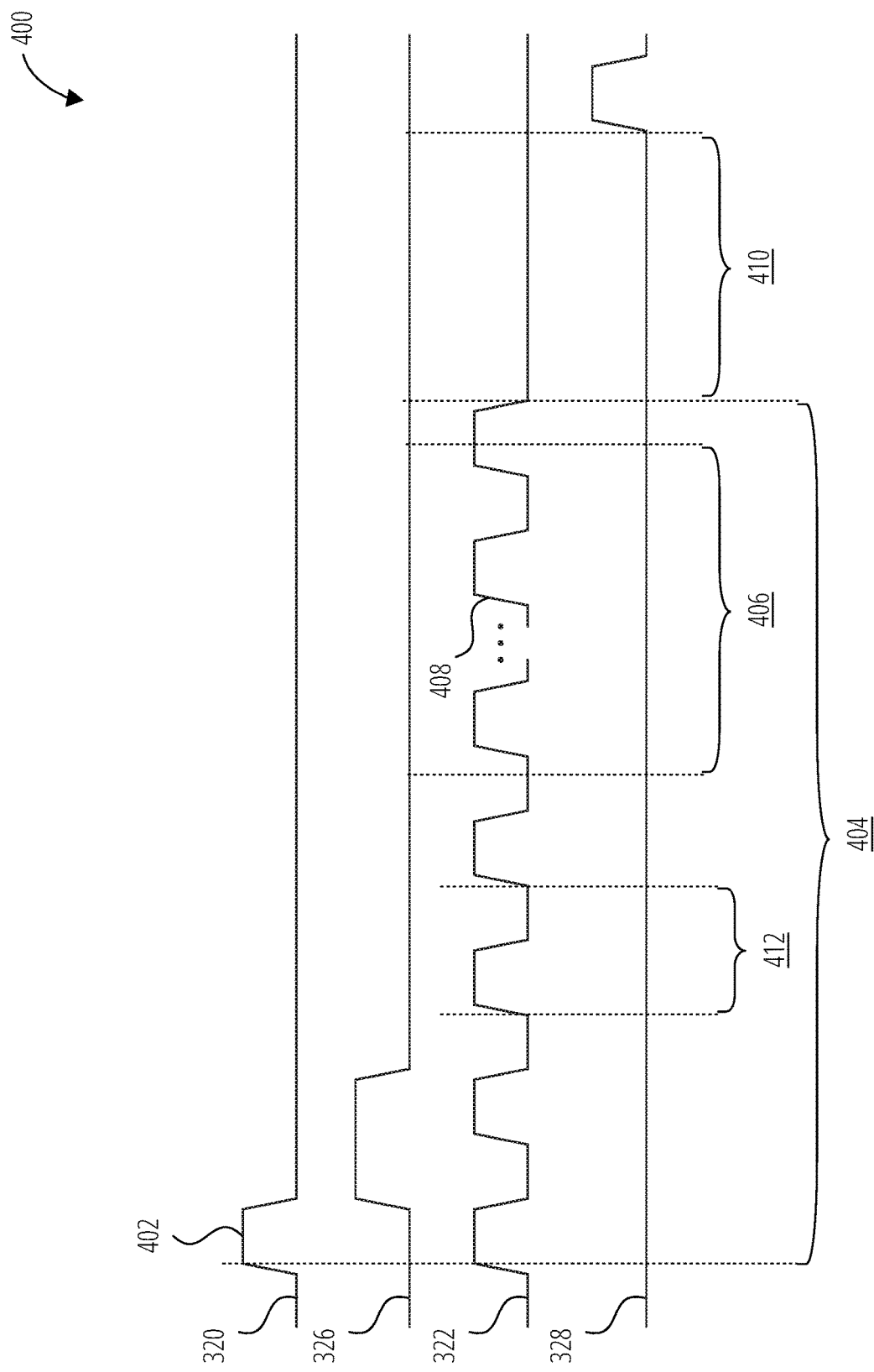
FIG. 4 depicts a timing diagram 400 in accordance with one embodiment.

FIG. 4 depicts a timing diagram 400 in accordance with one embodiment. The first control signal 320, initialization signal 326, run clock signal 322, and second control signal 328 introduced in FIG. 3 are shown in a representative sampling event. FIG. 4 is intended to illustrate potential behavior and usage of these signals in implementing the disclosed solution and is not intended to limit the scope of this disclosure.

A signal pulse 402 may be initiated by the controller 316 introduced in FIG. 3 on the first control signal 320. In response, a run clock signal 322 may be configured to run for a predefined number of clock cycles 404 subsequent to the signal pulse 402 on the first control signal 320. After the first control signal 320 and during the clock cycles of the run clock signal 322, the data signal is sent along a delay line.

The controller 316 may send the run clock signal 322 to the second data latch 312 for a sampling period 406. The sampling period 406 may be the time needed to register a predefined number of rising edges 408 on the run clock signal 322. "Rising edge" refers to a portion of an electronic signal such as a data signal, either analog or digital, that is in the process of transitioning from a low logic level (e.g., a low magnitude) to a high logic level (e.g., a high magnitude).

The controller 316 may send the second control signal 328 to the third data latch circuit 314 after a resolution time 410 following the sampling period 406. "Resolution time" refers to a period of time configured to be of a sufficient duration to enable a signal, such as an output signal to settle or resolve to have either a high logic value or a low logic value. In one embodiment, the resolution time 410 may comprise more than two clock cycles 412 of the run clock signal 322.

Figure 5:
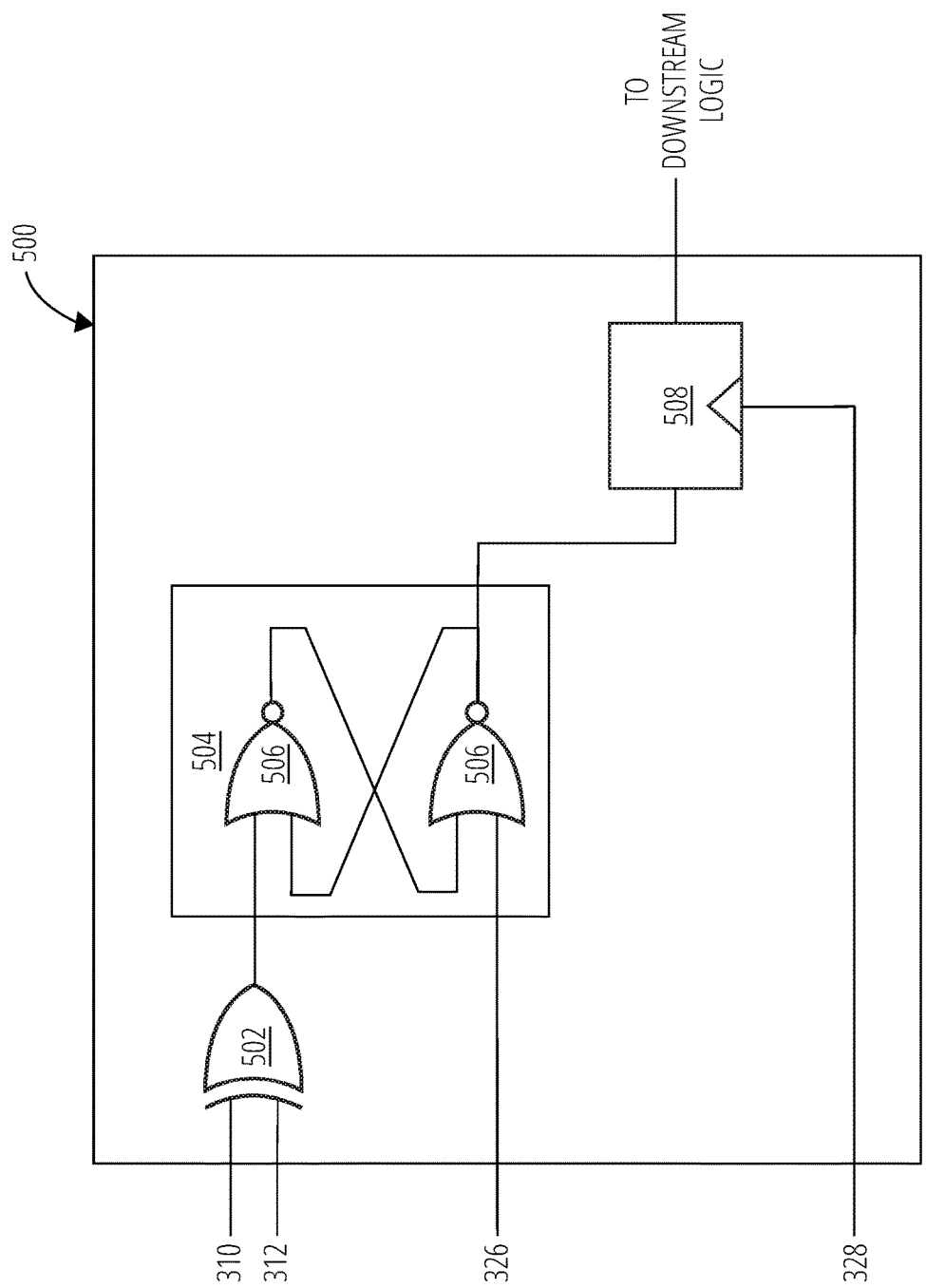
FIG. 5 depicts a third data latch circuit 500 in accordance with one embodiment.

FIG. 5 depicts a third data latch circuit 500 in accordance with one embodiment. The third data latch circuit 500 comprises an XOR gate 502, an SR NOR latch 504 configured from two NOR gates 506, and a flip flop 508, connected as shown. "XOR gate" refers to a circuit, sub-circuit, circuitry, electronic component, hardware, software, firmware, module, logic, device, or apparatus configured, programmed, designed, arranged, or engineered to perform the XOR logic function.

The XOR gate 502 receives the output from the first data latch 310 as a first input and output from the second data latch 312 as a second input. The SR NOR latch 504 receives output of the XOR gate 502 on the set terminal of the SR NOR latch 504 and the initialization signal 326 as input on the reset terminal of the SR NOR latch 504. The cross coupled NOR gates 506 implement the logic of the SR NOR latch 504. The flip flop 508 receives output from the SR NOR latch 504 as an input and receives a second control signal 328 as input which causes the flip flop 508 to sample the output from the SR NOR latch 504.

Those of skill in the art will recognize that certain embodiments may modify the third data latch circuit 500 such that an SR latch is used in place of the SR NOR latch 504. In addition, using an SR latch in place of the SR NOR latch 504, other circuitry may be added to third data latch circuit 500, such as inverters, so that the third data latch circuit 500 implements substantially the same functionality using an SR latch as the illustrated embodiment that uses an SR NOR latch 504.

Figure 6:
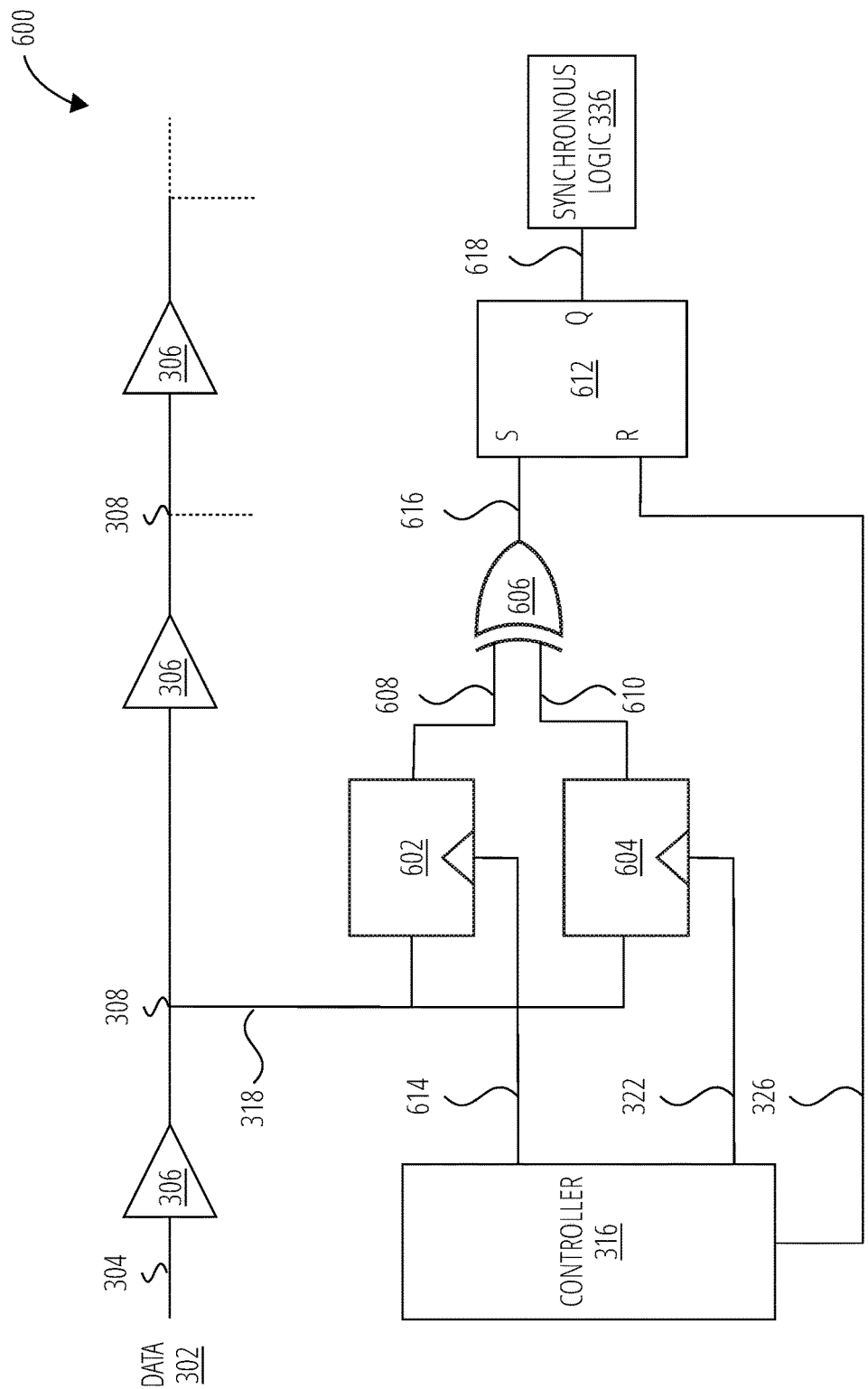
FIG. 6 depicts a circuit 600 in accordance with one embodiment.

FIG. 6 depicts a circuit 600 in accordance with one embodiment. The circuit 600 comprises an input for a data signal 302, a first D flip flop 602, a second D flip flop 604, an XOR gate 606, and an SR NOR latch 612.

The first D flip flop 602 may be configured to sample a delayed version 318 of the data signal 302 in response to an initialization clock signal 614. The second D flip flop 604 may sample the delayed version 318 of the data signal 302 in response to, or based on, a run clock signal 322 configured to run for a sampling period. The run clock signal 322 may be synchronized with the initialization clock signal 614. "Initialization clock signal" refers to a clock signal configured to cause an electronic component to transition to an initial state in preparation for performing a feature or function associated with the electronic component.

The XOR gate 606 may detect a change in an output signal 608 of the first D flip flop 602 or the output signal 610 of the second D flip flop 604 in response to the run clock signal 322. The SR NOR latch 612 may receive an output signal 616 from the XOR gate 606 and store this change in the signal registered by either the first D flip flop 602 or the second D flip flop 604. The SR NOR latch 612 may store the output signal of the first D flip flop 602 and second D flip flop 604 in response to a change in the output signal coming from the first D flip flop 602 and the second D flip flop 604 during a sampling period.

In one embodiment, the circuit 600 may further comprise a third D flip flop (not shown). The third D flip flop may sit between the SR NOR latch 612 and the synchronous logic 336 and may be configured to receive an output signal 618 from the SR NOR latch 612 and pass the output signal 618 to synchronous logic 336 in response to a post clock signal. "Post clock signal" refers to a control signal configured to cause a latch to sense a final single-bit data value.

The data signal 302 may comprise a predefined frequency of alternating low logic level data and high logic level data. "Low logic level" refers to one of two possible logic levels used to represent binary data and/or binary data signals. Typically, a low logic level represents the binary value "0." "High logic level" refers to one of two possible logic levels used to represent binary data and/or binary data signals. Typically, a high logic level represents the binary value "1." "Logic level" refers to a predefined level or range of levels for an electronic signal that defines a specific logic condition such as 'true' or 'on' or a binary '1' value. In addition, or alternatively, a logic level may define a specific logic condition such as 'false' or 'off' or a binary '0' value.

In one embodiment, the circuit 600 may comprise a controller 316. The controller 316 may send the initialization clock signal 614 to the first D flip flop 602. The controller 316 may reset the SR NOR latch 612 after sending the initialization clock signal 614. The controller 316 may send the run clock signal 322 to the second D flip flop 604 for a sampling period. The controller 316 may sample the SR NOR latch 612 after the sampling period. The sampling period may comprise a resolution time configured to account for metastability of the first D flip flop 602 and the second D flip flop 604. In one embodiment, the resolution time may comprise more than two clock cycles of the run clock signal 322.

Figure 7:
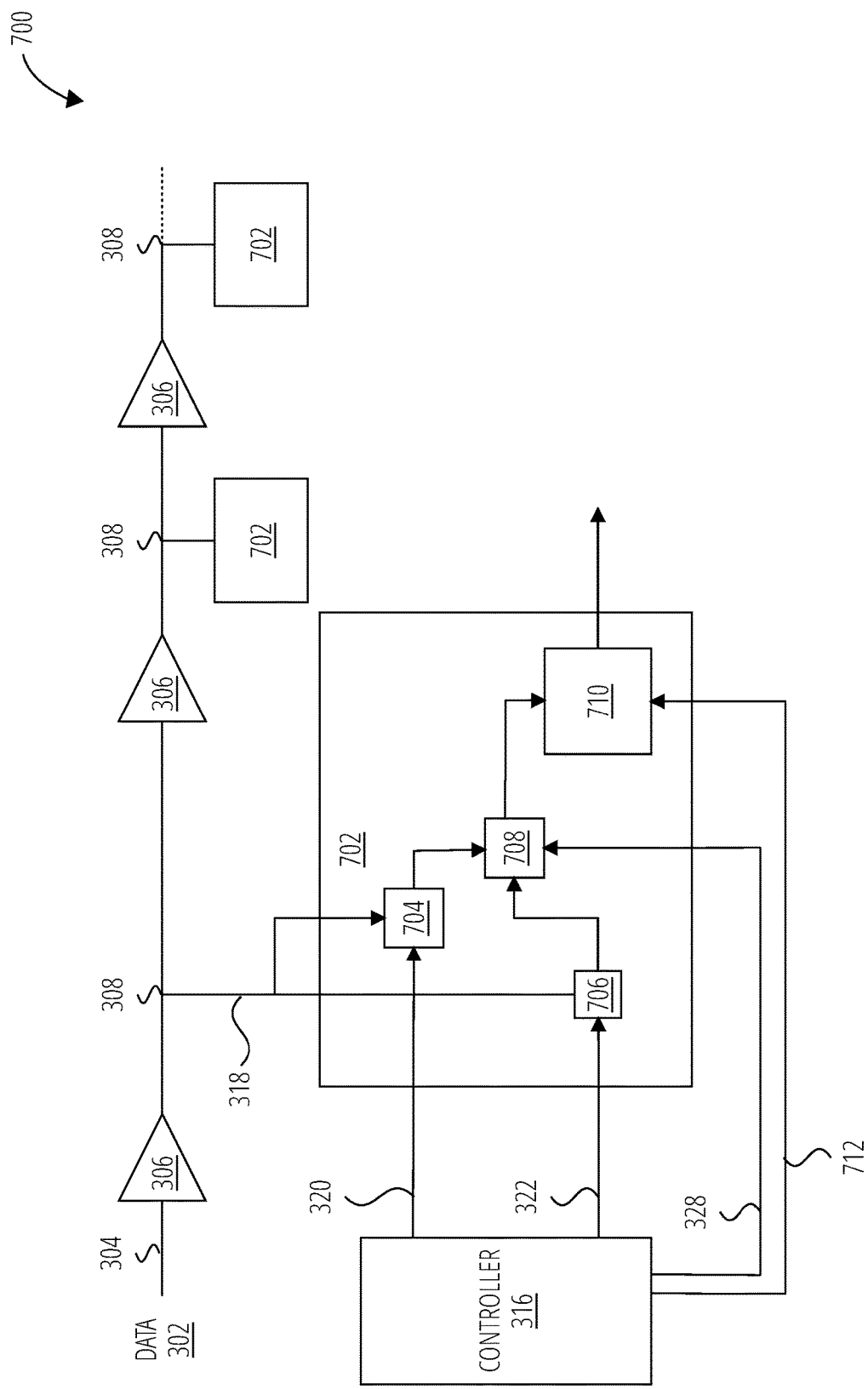
FIG. 7 depicts a circuit 700 in accordance with one embodiment.

FIG. 7 depicts a circuit 700 in accordance with one embodiment. The circuit 700 comprises a plurality of buffer circuits 702. Each buffer circuit 702 may include a first sampling circuit 704, a second sampling circuit 706, a third sampling circuit 708, and a fourth sampling circuit 710. "Sampling circuit" refers to a circuit, sub-circuit, circuitry, electronic component, hardware, software, firmware, module, logic, device, or apparatus configured, programmed, designed, arranged, or engineered to store one or more binary data values. Advantageously, the buffer circuit 702 buffers data values based on a data signal and is tolerant of metastable signals that electronic components of the buffer circuit 702 may experience.

In one embodiment, the first sampling circuit 704 may be connected to a delay line 304. The second sampling circuit 706 may be connected to the delay line 304 and a run clock signal 322. The first sampling circuit 704 and the second sampling circuit 706 may register a rising edge of a data signal 302 on the delay line 304.

The third sampling circuit 708 may be connected to the first sampling circuit 704 and the second sampling circuit 706. The third sampling circuit 708 may store a high logic level when the first sampling circuit 704 and the second sampling circuit 706 each output different logic levels. A fourth sampling circuit 710 may connect to the third sampling circuit 708. The fourth sampling circuit 710 may determine an output signal of the third sampling circuit 708.

The circuit 700 may include a controller 316. The controller 316 may send a first control signal 320 to the first sampling circuit 704 in sync with the run clock signal 322 to sample an edge of the data signal, such as a rising edge. The controller 316 may reset the third sampling circuit 708 using a second control signal 328. The controller 316 may send the run clock signal 322 to the second sampling circuit 706 for a sampling period. The controller 316 may finally send a third control signal 712 to the fourth sampling circuit 710 after a resolution time following the sampling period.

In one embodiment, the circuit 700 may include a number of buffer circuits 702, each buffer circuit 702 comprising a first sampling circuit 704, a second sampling circuit 706, a third sampling circuit 708, and a fourth sampling circuit 710. "Buffer circuit" refers to a circuit, sub-circuit, circuitry, electronic component, hardware, software, firmware, module, logic, device, or apparatus configured, programmed, designed, arranged, or engineered to store one or more binary data values.

The circuit 700 may also include an encoder configured to receive a thermometer code (not shown in FIG. 7) from the outputs of the buffer circuits 702 and convert the thermometer code to a binary code. The output of each buffer circuit 702 may comprise a single digit in the thermometer code. The controller 316 may be configured to determine a timing margin between the data signal 302 and the run clock signal 322 after the sampling period based on the thermometer code. "Timing margin" refers to a measure between two events. In the context of a time to digital converter a timing margin is a measure of time between when an electronic component clearly senses a data signal pulse as a low logic level and a high logic level.

Figure 8:
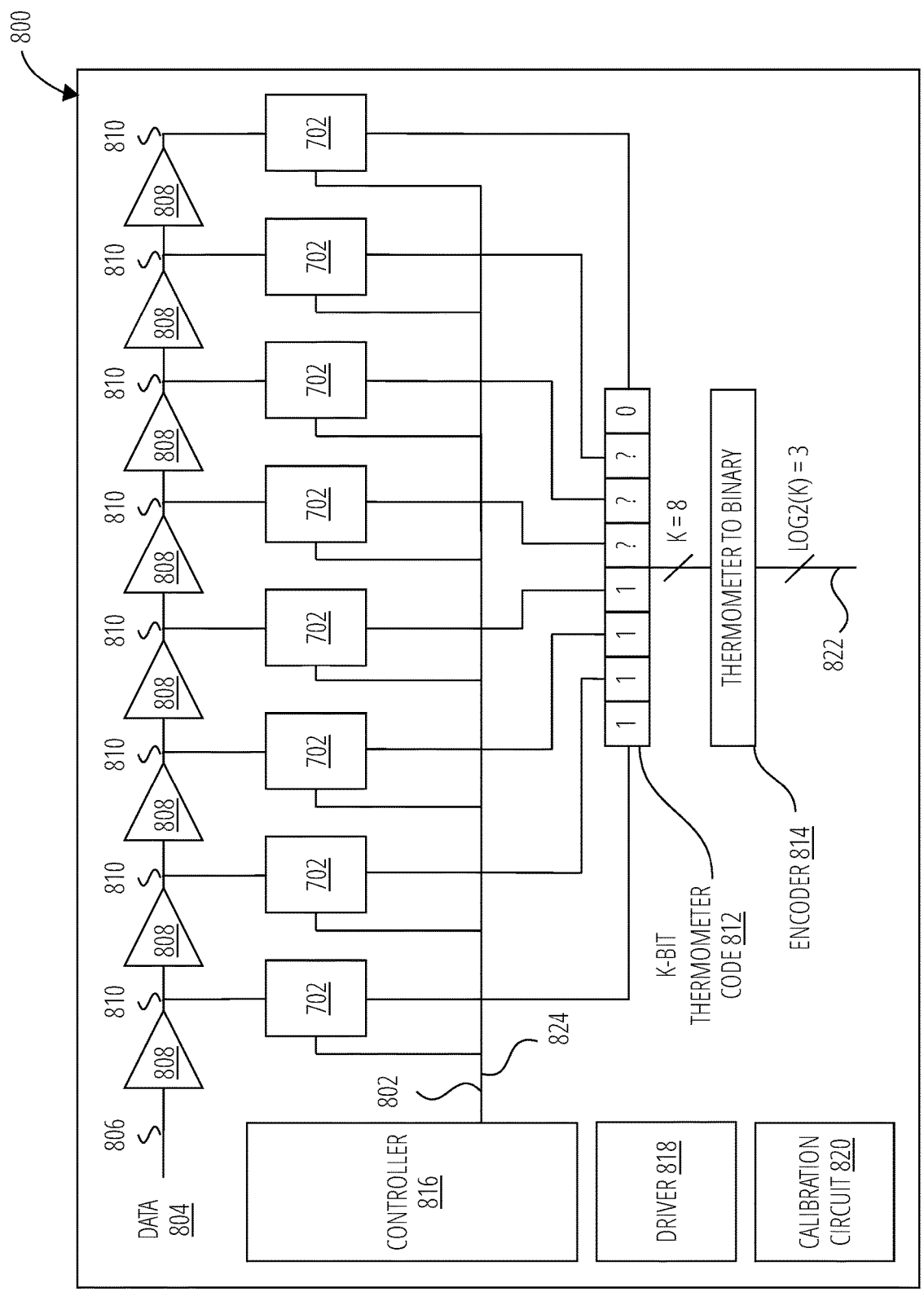
FIG. 8 depicts a system 800 in accordance with one embodiment.

FIG. 8 depicts a system 800 in accordance with one embodiment. The system 800 comprises a plurality of buffer circuits 702, a clock signal 802, a data signal 804 on a delay line 806, delay components 808, nodes 810, a thermometer code 812, an encoder 814, a controller 816, a driver 818, and a calibration circuit 820. The controller 816 may connect to the plurality of buffer circuits 702 using a communication bus 824 that includes the clock signal 802 as well as one or more other control signal for operating the plurality of buffer circuits 702. "Communication bus" refers to hardware, software, firmware, logic, control line(s), and one or more associated communication protocols, that are configured to enable a sender to send data, and/or a set of analog or digital electronic signals, to a receiver. A communication bus may include a data bus and/or a control bus. A communication bus may be implemented as a parallel communication bus or a serial communication bus. A communication bus may be implemented using a set of control lines, for example, in a parallel communication bus, The delay line 806 may carry the data signal 804 and may comprise a set of nodes 810 separated by delay components 808. The driver 818 may be configured to send the data signal 804 onto the delay line 806 for a sampling period in response to a change in the clock signal 802. In one embodiment, the data signal 804 may comprise a rising edge of an analog signal. "Driver" refers to a circuit, sub-circuit, electronic component, hardware, software, firmware, module, logic, device, or apparatus configured, programmed, designed, arranged, or engineered to supply a voltage or current, either in analog or digital wave form, to another circuit, sub-circuit, electronic component, logic, device, or apparatus.

In another embodiment, a driver may supply a current to another circuit or component at a predefined level/magnitude. Often, a single driver, also referred to herein as a driver circuit, is configured to supply a voltage and/or current at one of a plurality of predefined levels or magnitudes, or frequencies based on control signals provided to the driver.

The buffer circuits 702 may each connect to one node 810. Each buffer circuit 702 may be configured to output a binary value for one digit of a thermometer code 812. The encoder 814 may receive the thermometer code 812 from the buffer circuits 702 and may convert the thermometer code 812 to a binary code 822.

The controller 816 may determine a jitter within the data signal 804 based on the binary code 822. "Jitter" refers to unpredictable movement of a signal from an expected level, magnitude, timing, or behavior, to a higher or lower level, magnitude, or behavior. The system 800 may, in one embodiment, include a calibration circuit 820 that may adjust a frequency for the clock signal 802 in response to jitter determined during the sampling period that is above a maximum jitter threshold. In one embodiment, the calibration circuit 820 may operate the system 800 for a sampling period and compare the results from one sampling period to another and thereby determine whether to adjust the clock cycle of the clock signal 802 to facilitate sensing the data signal 804.

"Calibration circuit" refers to any circuit, sub-circuit, electronic component, hardware, software, firmware, module, logic, device, or apparatus configured, programmed, designed, arranged, or engineered to change, alter, modify, update, configure, or calibrate a configuration parameter, including but not limited to a read level.

Figure 9A:
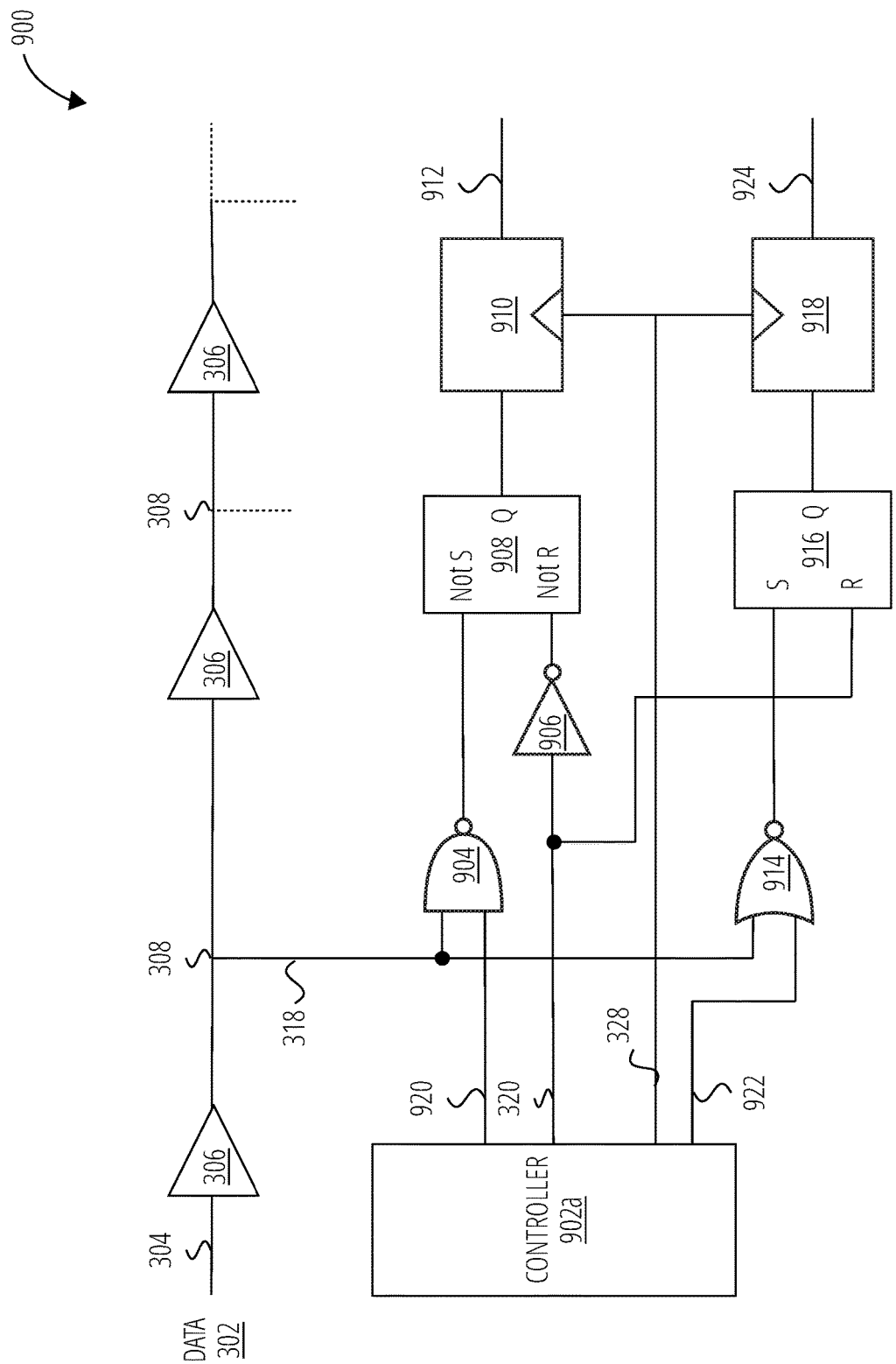
FIG. 9A depicts a circuit 900 in accordance with one embodiment.

FIG. 9A depicts a circuit 900 in accordance with one embodiment. The circuit 900 comprises a controller 902a, a NAND gate 904, an inverter 906, a first SR latch 908, a data latch 910, a NOR gate 914, a second SR latch 916, and a data latch 918. The circuit 900 also comprises a delay line 304 including delay components 306 and nodes 308 across the delay line 304 at which a delayed version 318 of a data signal 302 may be detected as previously described. The controller 902a may be configured to provide a first sampling signal 920 and a second sampling signal 922 in addition to the first control signal 320 and second control signal 328 previously described.

The NAND gate 904 takes as its two inputs the delayed version 318 of the data signal 302 and the first sampling signal 920. The output of the NAND gate 904 is fed to the first SR latch 908 as its set input ("Not S"). The reset ("Not R") input of the first SR latch 908 receives the first control signal 320, inverted by inverter 906. The output of the first SR latch 908 is latched by the data latch 910, which receives the second control signal 328 from the controller 902a as its control. The data latch 910 provides an output representing any ones 912 detected on the delay line 304.

The NOR gate 914 takes as its two inputs the delayed version 318 of the data signal 302 and the second sampling signal 922. The output of the NOR gate 914 is fed to the second SR latch 916 as its set input. The reset input of the second SR latch 916 receives the first control signal 320 (uninverted). The output of the second SR latch 916 is latched by the data latch 918, which receives the second control signal 328 from the controller as its control. The data latch 918 provides an output representing any zeroes 924 detected on the delay line 304. first SR latch 908 and second SR latch 916 may in some embodiments be implemented using cross-coupled NAND gates and cross-coupled NOR gates, respectively.

Those of skill in the art will appreciate that while a NAND gate 904 and NOR gate 914 are illustrated in the embodiment shown in FIG. 9A, other logic gates may be used in place of the particular NAND gate 904 and/or NOR gate 914 illustrated. Use of other logic gates such as an AND gate, an NAND gate, an OR gate, an NOR gate, may be used in place of the NAND gate 904 and/or NOR gate 914 and may be used in combination with other logic such as inverters or other sub-circuits so long as the output signal for a particular set of input signals is the same for a given set of input values as for those components illustrated in the embodiment of FIG. 9A.

Similarly, those of skill in the art will appreciate that the first SR latch 908 and second SR latch 916 may be implemented using a variety of data latches. In one embodiment, the first SR latch 908 can be an SR NAND latch and the second SR latch 916 can be an SR NOR latch. Alternatively, in another embodiment the first SR latch 908 can be an SR NOR latch and the second SR latch 916 can be an SR NAND latch, with each of the first SR latch and second SR latch including other logic such that the resulting circuit performs the same logic function.

While a NAND gate 904 and NOR gate 914 are illustrated in the embodiment shown in FIG. 9A, that other logic gates may be used in place of the particular NAND gate 904 and/or NOR gate 914 illustrated. Use of other logic gates such as an AND gate, NAND gate, OR gate, NOR gate, may be used in place of the NAND gate 904 and/or NOR gate 914 and may be used in combination with other logic such as inverters or other sub-circuits so long as the output signal for a particular set of input signals is the same as for those components illustrated in the embodiment of FIG. 9A.

This embodiment accepts a data signal 302 input as previously described. Circuit 900 detects variations in the timing of rising edges of data signal 302 with respect to sampling signals (e.g., first sampling signal 920 and second sampling signal 922). First sampling signal 920 and second sampling signal 922 may be derived from a common clock using a state machine. Alternatively, or in addition, logic within the controller 902a may generate the first sampling signal 920 and second sampling signal 922. One embodiment of such logic is indicated within controller 902b, illustrated in FIG. 9B. In the embodiment of FIG. 9A, the first sampling signal 920 may comprise a clock signal configured for sampling '1's in the data signal 302 (e.g., a run clock signal 1) and the second sampling signal 922 may comprise a clock signal configured for sampling '0's in the data signal 302 (e.g., a run clock signal 0).

When data signal 302 rises "early" with respect to second sampling signal 922 and first sampling signal 920, data signal 302 may have a logic level of "1" when first sampling signal 920 is high. This results in the output of NAND gate 904 to pulse low, setting the first SR latch 908. When data signal 302 rises "late" with respect to second sampling signal 922 and first sampling signal 920, data signal 302 will be a "0" when second sampling signal 922 is low. This causes the output of NOR gate 914 to pulse high, setting the second SR latch 916.

After a number of cycles of data signal 302, second sampling signal 922, and first sampling signal 920, and an additional period of resolution time, second control signal 328 (which may be a "post clock" signal) rises. Second control signal 328 may be derived from a common clock by the controller 902a (not illustrated). Rising of second control signal 328 captures the outputs of the two SR latches (e.g., data latch 910 and data latch 918) into signals any ones 912 and any zeroes 924. Any ones 912 will be high if the output of NAND gate 904 was low for long enough to set first SR latch 908. Any zeroes 924 will be low if the output of NOR gate 914 was high for long enough to set its second SR latch 916.

The timing of second sampling signal 922 and first sampling signal 920 may be configured such that they do not detect a '1' or '0' for data signal 302 near the time of a falling edge of data signal 302. Thus, an approximate timing for data signal 302 may be known in advance by the controller 902a generating second sampling signal 922 and first sampling signal 920. With approximate timing margins, a collection of these circuits connected to nodes 308 along the delay line 304 may detect fine variations in the timing of data signal 302. Some embodiments of the circuit 900 may be sensitive to the falling edge of data signal 302, or to both rising and falling edges of data signal 302.

Depending on the application, the circuit 900 may be used as illustrated and be used to detect whether the data signal 302 presented any ones 912 and any zeroes 924. Alternatively, in one embodiment, the circuit 900 may be the same as illustrated in FIG. 9A, with the exception that NOR gate 914, second sampling signal 922, second SR latch 916, data latch 918, and any zeroes 924 signals and components may be removed or omitted. Such an embodiment, may be used to detect exclusively whether the data signal 302 presented any ones 912. Alternatively, in one embodiment, the circuit 900 may be the same as illustrated in FIG. 9A, with the exception that NAND gate 904, inverter 906, first SR latch 908, data latch 910, any ones 912 signal, and first sampling signal 920 signals and components may be removed or omitted. Such an embodiment, may be used to detect exclusively whether the data signal 302 presented any zeroes 924.

In one embodiment, the circuit 900 may comprise an input for a data signal 302, a first SR latch 908, a first sampling signal 920, and a second control signal. The first SR latch 908 may comprise a set terminal connected to a NAND gate, such as NAND gate 904, and output connected to a first D flip flop (in place of data latch 910), and a reset terminal connected to an inverted version of a first control signal, such as the first control signal 320 inverted by inverter 906. The first sampling signal 920 may be connected to one terminal of the NAND gate 904 and a delayed version 318 of the data signal 302 may be connected to another terminal of the NAND gate 904. The second control signal may be configured to sample an output signal of the first D flip flop after a predefined number of clock cycles (e.g., a resolution time) of the first sampling signal.

In one embodiment, a second SR latch 916 may comprise a set terminal connected to a NOR gate 914, and an output connected to a second D flip flop, placed as shown by data latch 918. The second SR latch 916 may also comprise a reset terminal connected to the first control signal 320. A second sampling signal 922 may be connected to one terminal of the NOR gate 914. A delayed version 318 of the data signal 302 may be connected to another terminal of NOR gate 914. The second control signal 328 may be configured to sample an output signal of the second D flip flop after a predefined number of clock cycles (e.g., a resolution time) of the second sampling signal.

In one embodiment, the circuit 900 may comprise an input for a data signal 302, a first SR latch 908, a first sampling signal, and a second control signal. The first SR latch 908 may comprise a set terminal connected to a NAND gate, such as NAND gate 904, and output connected to a first D-flip D flip flop (in place of data latch 910), and a reset terminal connected to an inverted version of a first control signal, such as the first control signal 320 inverted by inverter 906. The first sampling signal may be connected to one terminal of the NAND gate 904, as shown with first sampling signal 920, and a delayed version 318 of the data signal 302 may be connected to another terminal of the NAND gate 904. The second control signal may be configured to sample an output signal of the first D flip flop after a predefined number of clock cycles of the first sampling signal. A second SR latch 916 may comprise a set terminal connected to a NOR gate 914, and an output connected to a second D flip flop, placed as shown by data latch 918. The second SR latch 916 may also comprise a reset terminal connected to the first control signal 320. A second sampling signal may be connected to one terminal of the NOR gate 914, such as is shown by second sampling signal 922. A delayed version 318 of the data signal 302 may be connected to another terminal of NOR gate 914. The second control signal 328 may be configured to sample an output signal of the second D flip flop after a predefined number of clock cycles of the second sampling signal.

In one embodiment, the first sampling signal 920 and second sampling signal 922 may be derived from a separate clock signal that has twice the frequency of the first sampling signal 920 and the second sampling signal 922.

Figure 9B:
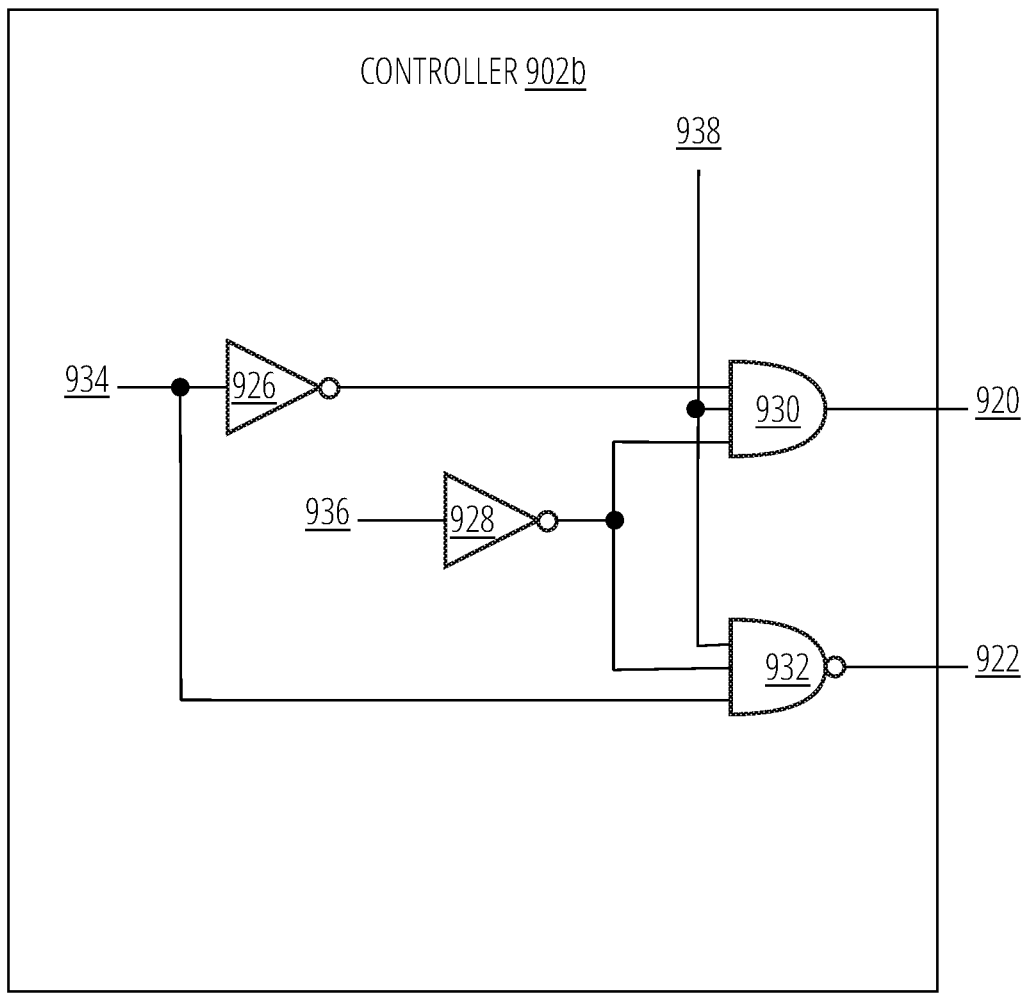
FIG. 9B illustrates an aspect of the circuit described in FIG. 9A in accordance with one embodiment.

FIG. 9B illustrates a controller 902b that may be implemented within the circuit 900 of FIG. 9A in place of controller 902a to produce a first sampling signal 920 and a second sampling signal 922. In this embodiment because of how the first sampling signal 920 and second sampling signal 922 are generated, a pair of sampling windows are generated. When the first sampling signal 920 is high, a ones sampling window is generated. When the second sampling signal 922 is high, a zeros sampling window is generated.

The controller 902b may comprise an inverter 926, an inverter 928, an AND gate 930, and a NAND gate 932. A clock signal 934 may connect to an input for NAND gate 932. The clock signal 934 may also connect to the inverter 926. The inverted clock signal may then connect as an input to the AND gate 930. In one embodiment, the clock signal 934 may comprise a run clock signal. The run clock signal may be used to initiate and complete sampling for delays and may be managed by logic within the controller 902b.

An initialization signal 936 may be inverted by inverter 928. The inverted initialization signal may connect to an input to both AND gate 930 and NAND gate 932. A data signal 938, similar to the delayed version 318 earlier described, may connect to an input to both AND gate 930 and NAND gate 932. In one embodiment, the data signal 938 is connected to a different node 308 than the delayed version 318. AND gate 930 may have first sampling signal 920 as its output signal. NAND gate 932 may have second sampling signal 922 as its output signal.

The data signal (data signal 202 and data signal 302) used throughout this disclosure, which is the signal sent to a first stage of the delay line (e.g., delay line 204, delay line 304, or delay line 806) in a TDC, may be generated by a flip flop that alternates it's value every 2× clock cycle, where 2× clock is a separate clock that runs at twice the frequency of a system clock. Alternatively, or in addition, the data signal (data signal 202 and data signal 302) used throughout this disclosure, may also be a buffered version of a system clock. In either embodiment, the buffered or latched clock may pass through a coarse delay component. In certain embodiments, the controller 902b may be configured to measure a delay through the coarse delay component in relation to a clock period of the clock signal 934. In the illustrated embodiment of FIG. 9B, data signal 938 may comprise an output of the coarse delay component.

In controller 902b, the data signal 938 may be ANDed with an inverted clock signal 934 and an inverted initialization signal 936 to produce the ones sampling window initiated and completed based on a value for the first sampling signal 920. This first sampling signal 920 may be fed to downstream samplers configured to measure any ones 912 as shown in FIG. 9A. Data signal 938 may also be NANDed with clock signal 934 and an inverted initialization signal 936 to produce a zeros sampling window initiated and completed based on a value for the second sampling signal 922.

Downstream sampling logic may use cross-coupled NAND gate based SR latches for the first SR latch 908 and cross-coupled NOR based SR latches for the second SR latch 916. In other embodiments, other types of latches or circuits may be used in place of first SR latch 908 and second SR latch 916, as long as the signals used are inverted appropriately to provide the desired output signals.

In some embodiments, only any ones 912 detection logic may be desired. For example, circuit 900 may not include second sampling signal 922, NOR gate 914, second SR latch 916, and data latch 918. In other embodiments, only any zeroes 924 logic may be desired. For example, circuit 900 may not include first sampling signal 920, NAND gate 904, inverter 906, first SR latch 908, and data latch 910. Some embodiments may implement both as illustrated here and in FIG. 9A.

Example Computing Device

Figure 10A:
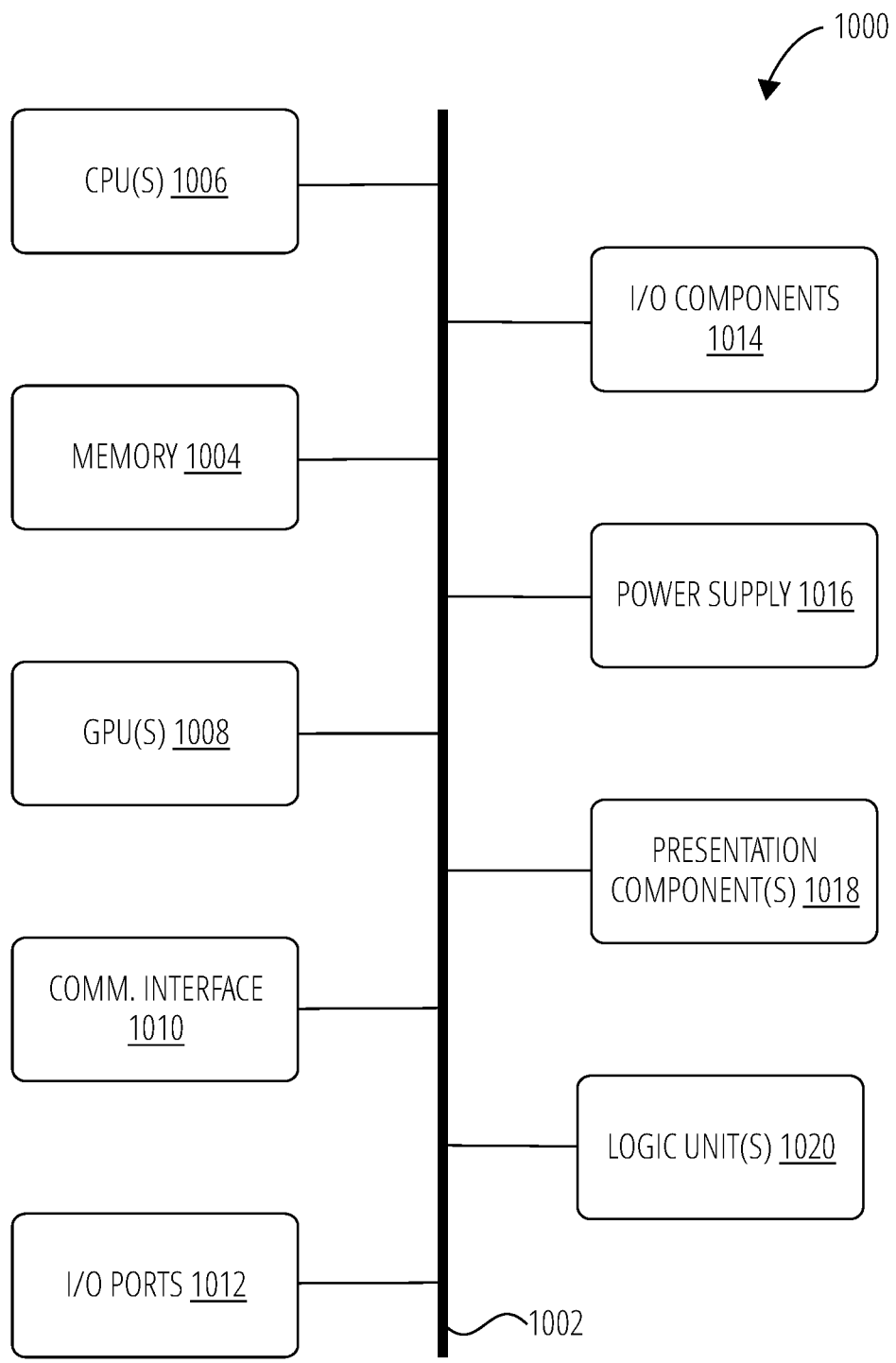
FIG. 10A is a block diagram of an example computing system 1000 suitable for use in implementing some embodiments of the present disclosure.

FIG. 10A is a block diagram of an example computing system 1000 suitable for use in implementing some embodiments of the present disclosure. The computing system 1000 may include an interconnect system 1002 that directly or indirectly couples the following devices: memory 1004, one or more central processing units (CPU(s) 1006), one or more graphics processing units (GPU(s) 1008), a communication interface 1010, input/output ports (I/O ports 1012), input/output components (I/O components 1014), a power supply 1016, one or more presentation component(s) 1018 (e.g., display(s)), and one or more logic unit(s) 1020.

Although the various blocks of FIG. 10A are shown as connected via the interconnect system 1002 with lines, this is not intended to be limiting and is provided for clarity. For example, in some embodiments, a presentation component 1018, such as a display device, may be considered an I/O component 1014 (e.g., if the display is a touch screen). As another example, the CPU(s) 1006 and/or GPU(s) 1008 may include memory (e.g., the memory 1004 may be representative of a storage device in addition to the memory of the GPU(s) 1008, the CPU(s) 1006, and/or other components). In other words, the computing device of FIG. 10A is merely illustrative. Distinction is not made between such categories as "workstation," "server," "laptop," "desktop," "tablet," "client device," "mobile device," "hand-held device," "game console," "electronic control unit (ECU)," "virtual reality system," and/or other device or system types, as all are contemplated within the scope of the computing device of FIG. 10A.

The interconnect system 1002 may represent one or more links or busses, such as an address bus, a data bus, a control bus, or a combination thereof. The interconnect system 1002 may include one or more bus or link types, such as an industry standard architecture (ISA) bus, an extended industry standard architecture (EISA) bus, a video electronics standards association (VESA) bus, a peripheral component interconnect (PCI) bus, a peripheral component interconnect express (PCIe) bus, and/or another type of bus or link. In some embodiments, there are direct connections between components. As an example, the CPU(s) 1006 may be directly connected to the memory 1004. Further, the CPU(s) 1006 may be directly connected to the GPU(s) 1008. Where there is direct, or point-to-point connection between components, the interconnect system 1002 may include a PCIe link to carry out the connection. In these examples, a PCI bus need not be included in the computing system 1000.

The memory 1004 may include any of a variety of computer-readable media. The computer-readable media may be any available media that may be accessed by the computing system 1000. The computer-readable media may include both volatile and nonvolatile media, and removable and non-removable media. By way of example, and not limitation, the computer-readable media may comprise computer-storage media and communication media.

The computer-storage media may include both volatile and nonvolatile media and/or removable and non-removable media implemented in any method or technology for storage of information such as computer-readable instructions, data structures, program modules, and/or other data types. For example, the memory 1004 may store computer-readable instructions (e.g., that represent a program(s) and/or a program element(s), such as an operating system. Computer-storage media may include, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by computing system 1000. As used herein, computer storage media does not comprise signals per se.

The computer storage media may embody computer-readable instructions, data structures, program modules, and/or other data types in a modulated data signal such as a carrier wave or other transport mechanism and includes any information delivery media. "Data signal" refers to an electrical signal (analog or digital, sent by wired or wireless) sent from one component, circuit, driver, device, manager, or controller to another component, circuit, driver, device, manager, or controller. In particular, a data signal is a signal configured to represent a data value. A data signal may be contrasted with a control signal configured to cause another device, component, manager, or controller to act in response to the control signal. The term "modulated data signal" may refer to a signal that has one or more of its characteristics set or changed in such a manner as to encode information in the signal. By way of example, and not limitation, the computer storage media may include wired media such as a wired network or direct-wired connection, and wireless media such as acoustic, RF, infrared and other wireless media. Combinations of any of the above should also be included within the scope of computer-readable media.

The CPU(s) 1006 may be configured to execute at least some of the computer-readable instructions to control one or more components of the computing system 1000 to perform one or more of the methods and/or processes described herein. The CPU(s) 1006 may each include one or more cores (e.g., one, two, four, eight, twenty-eight, seventy-two, etc.) that are capable of handling a multitude of software threads simultaneously. The CPU(s) 1006 may include any type of processor and may include different types of processors depending on the type of computing system 1000 implemented (e.g., processors with fewer cores for mobile devices and processors with more cores for servers). For example, depending on the type of computing system 1000, the processor may be an Advanced RISC Machines (ARM) processor implemented using Reduced Instruction Set Computing (RISC) or an x86 processor implemented using Complex Instruction Set Computing (CISC). The computing system 1000 may include one or more CPU(s) 1006 in addition to one or more microprocessors or supplementary co-processors, such as math co-processors.

In addition to or alternatively from the CPU(s) 1006, the GPU(s) 1008 may be configured to execute at least some of the computer-readable instructions to control one or more components of the computing system 1000 to perform one or more of the methods and/or processes described herein. One or more of the GPU(s) 1008 may be an integrated GPU (e.g., with one or more of the CPU(s) 1006 and/or one or more of the GPU(s) 1008 may be a discrete GPU. In embodiments, one or more of the GPU(s) 1008 may be a coprocessor of one or more of the CPU(s) 1006. The GPU(s) 1008 may be used by the computing system 1000 to render graphics (e.g., 3D graphics) or perform general purpose computations. For example, the GPU(s) 1008 may be used for General-Purpose computing on GPUs (GPGPU). The GPU(s) 1008 may include hundreds or thousands of cores that are capable of handling hundreds or thousands of software threads simultaneously. The GPU(s) 1008 may generate pixel data for output images in response to rendering commands (e.g., rendering commands from the CPU(s) 1006 received via a host interface). The GPU(s) 1008 may include graphics memory, such as display memory, for storing pixel data or any other suitable data, such as GPGPU data. The display memory may be included as part of the memory 1004. The GPU(s) 1008 may include two or more GPUs operating in parallel (e.g., via a link). The link may directly connect the GPUs (e.g., using NVLINK) or may connect the GPUs through a switch (e.g., using NVSwitch). When combined together, each GPU 1008 may generate pixel data or GPGPU data for different portions of an output or for different outputs (e.g., a first GPU for a first image and a second GPU for a second image). Each GPU may include its own memory or may share memory with other GPUs.

In addition to or alternatively from the CPU(s) 1006 and/or the GPU(s) 1008, the logic unit(s) 1020 may be configured to execute at least some of the computer-readable instructions to control one or more components of the computing system 1000 to perform one or more of the methods and/or processes described herein. In embodiments, the CPU(s) 1006, the GPU(s) 1008, and/or the logic unit(s) 1020 may discretely or jointly perform any combination of the methods, processes and/or portions thereof. One or more of the logic unit(s) 1020 may be part of and/or integrated in one or more of the CPU(s) 1006 and/or the GPU(s) 1008 and/or one or more of the logic unit(s) 1020 may be discrete components or otherwise external to the CPU(s) 1006 and/or the GPU(s) 1008. In embodiments, one or more of the logic unit(s) 1020 may be a coprocessor of one or more of the CPU(s) 1006 and/or one or more of the GPU(s) 1008.

Examples of the logic unit(s) 1020 include one or more processing cores and/or components thereof, such as Tensor Cores (TCs), Tensor Processing Units (TPUs), Pixel Visual Cores (PVCs), Vision Processing Units (VPUs), Graphics Processing Clusters (GPCs), Texture Processing Clusters (TPCs), Streaming Multiprocessors (SMs), Tree Traversal Units (TTUs), Artificial Intelligence Accelerators (AIAs), Deep Learning Accelerators (DLAs), Arithmetic-Logic Units (ALUs), Application-Specific Integrated Circuits (ASICs), Floating Point Units (FPUs), input/output (I/O) elements, peripheral component interconnect (PCI) or peripheral component interconnect express (PCIe) elements, and/or the like.

The communication interface 1010 may include one or more receivers, transmitters, and/or transceivers that enable the computing system 1000 to communicate with other computing devices via an electronic communication network, included wired and/or wireless communications. The communication interface 1010 may include components and functionality to enable communication over any of a number of different networks, such as wireless networks (e.g., Wi-Fi, Z-Wave, Bluetooth, Bluetooth LE, ZigBee, etc.), wired networks (e.g., communicating over Ethernet or InfiniBand), low-power wide-area networks (e.g., LoRaWAN, SigFox, etc.), and/or the Internet.

The I/O ports 1012 may enable the computing system 1000 to be logically coupled to other devices including the I/O components 1014, the presentation component(s) 1018, and/or other components, some of which may be built in to (e.g., integrated in) the computing system 1000. Illustrative I/O components 1014 include a microphone, mouse, keyboard, joystick, game pad, game controller, satellite dish, scanner, printer, wireless device, etc. The I/O components 1014 may provide a natural user interface (NUI) that processes air gestures, voice, or other physiological inputs generated by a user. In some instances, inputs may be transmitted to an appropriate network element for further processing. An NUI may implement any combination of speech recognition, stylus recognition, facial recognition, biometric recognition, gesture recognition both on screen and adjacent to the screen, air gestures, head and eye tracking, and touch recognition (as described in more detail below) associated with a display of the computing system 1000. The computing system 1000 may be include depth cameras, such as stereoscopic camera systems, infrared camera systems, RGB camera systems, touchscreen technology, and combinations of these, for gesture detection and recognition. Additionally, the computing system 1000 may include accelerometers or gyroscopes (e.g., as part of an inertia measurement unit (IMU)) that enable detection of motion. In some examples, the output of the accelerometers or gyroscopes may be used by the computing system 1000 to render immersive augmented reality or virtual reality.

The power supply 1016 may include a hard-wired power supply, a battery power supply, or a combination thereof. The power supply 1016 may provide power to the computing system 1000 to enable the components of the computing system 1000 to operate.

The presentation component(s) 1018 may include a display (e.g., a monitor, a touch screen, a television screen, a heads-up-display (HUD), other display types, or a combination thereof), speakers, and/or other presentation components. The presentation component(s) 1018 may receive data from other components (e.g., the GPU(s) 1008, the CPU(s) 1006, etc.), and output the data (e.g., as an image, video, sound, etc.).

Example Network Environments

Network environments suitable for use in implementing embodiments of the disclosure may include one or more client devices, servers, network attached storage (NAS), other backend devices, and/or other device types. The client devices, servers, and/or other device types (e.g., each device) may be implemented on one or more instances of the computing system 1000 of FIG. 10A—e.g., each device may include similar components, features, and/or functionality of the computing system 1000.

Components of a network environment may communicate with each other via a network(s), which may be wired, wireless, or both. The network may include multiple networks, or a network of networks. By way of example, the network may include one or more Wide Area Networks (WANs), one or more Local Area Networks (LANs), one or more public networks such as the Internet and/or a public switched telephone network (PSTN), and/or one or more private networks. Where the network includes a wireless telecommunications network, components such as a base station, a communications tower, or even access points (as well as other components) may provide wireless connectivity.

Compatible network environments may include one or more peer-to-peer network environments—in which case a server may not be included in a network environment—and one or more client-server network environments—in which case one or more servers may be included in a network environment. In peer-to-peer network environments, functionality described herein with respect to a server(s) may be implemented on any number of client devices.

In at least one embodiment, a network environment may include one or more cloud-based network environments, a distributed computing environment, a combination thereof, etc. A cloud-based network environment may include a framework layer, a job scheduler, a resource manager, and a distributed file system implemented on one or more of servers, which may include one or more core network servers and/or edge servers. A framework layer may include a framework to support software of a software layer and/or one or more application(s) of an application layer. The software or application(s) may respectively include web-based service software or applications. In embodiments, one or more of the client devices may use the web-based service software or applications (e.g., by accessing the service software and/or applications via one or more application programming interfaces (APIs)). The framework layer may be, but is not limited to, a type of free and open-source software web application framework such as that may use a distributed file system for large-scale data processing (e.g., "big data").

A cloud-based network environment may provide cloud computing and/or cloud storage that carries out any combination of computing and/or data storage functions described herein (or one or more portions thereof). Any of these various functions may be distributed over multiple locations from central or core servers (e.g., of one or more data centers that may be distributed across a state, a region, a country, the globe, etc.). If a connection to a user (e.g., a client device) is relatively close to an edge server(s), a core server(s) may designate at least a portion of the functionality to the edge server(s). A cloud-based network environment may be private (e.g., limited to a single organization), may be public (e.g., available to many organizations), and/or a combination thereof (e.g., a hybrid cloud environment).

The client device(s) may include at least some of the components, features, and functionality of the example computing system 1000 described herein with respect to FIG. 10A. By way of example and not limitation, a client device may be embodied as a Personal Computer (PC), a laptop computer, a mobile device, a smartphone, a tablet computer, a smart watch, a wearable computer, a Personal Digital Assistant (PDA), an MP3 player, a virtual reality headset, a Global Positioning System (GPS) or device, a video player, a video camera, a surveillance device or system, a vehicle, a boat, a flying vessel, a virtual machine, a drone, a robot, a handheld communications device, a hospital device, a gaming device or system, an entertainment system, a vehicle computer system, an embedded system controller, a remote control, an appliance, a consumer electronic device, a workstation, an edge device, any combination of these delineated devices, or any other suitable device.

Figure 10B:
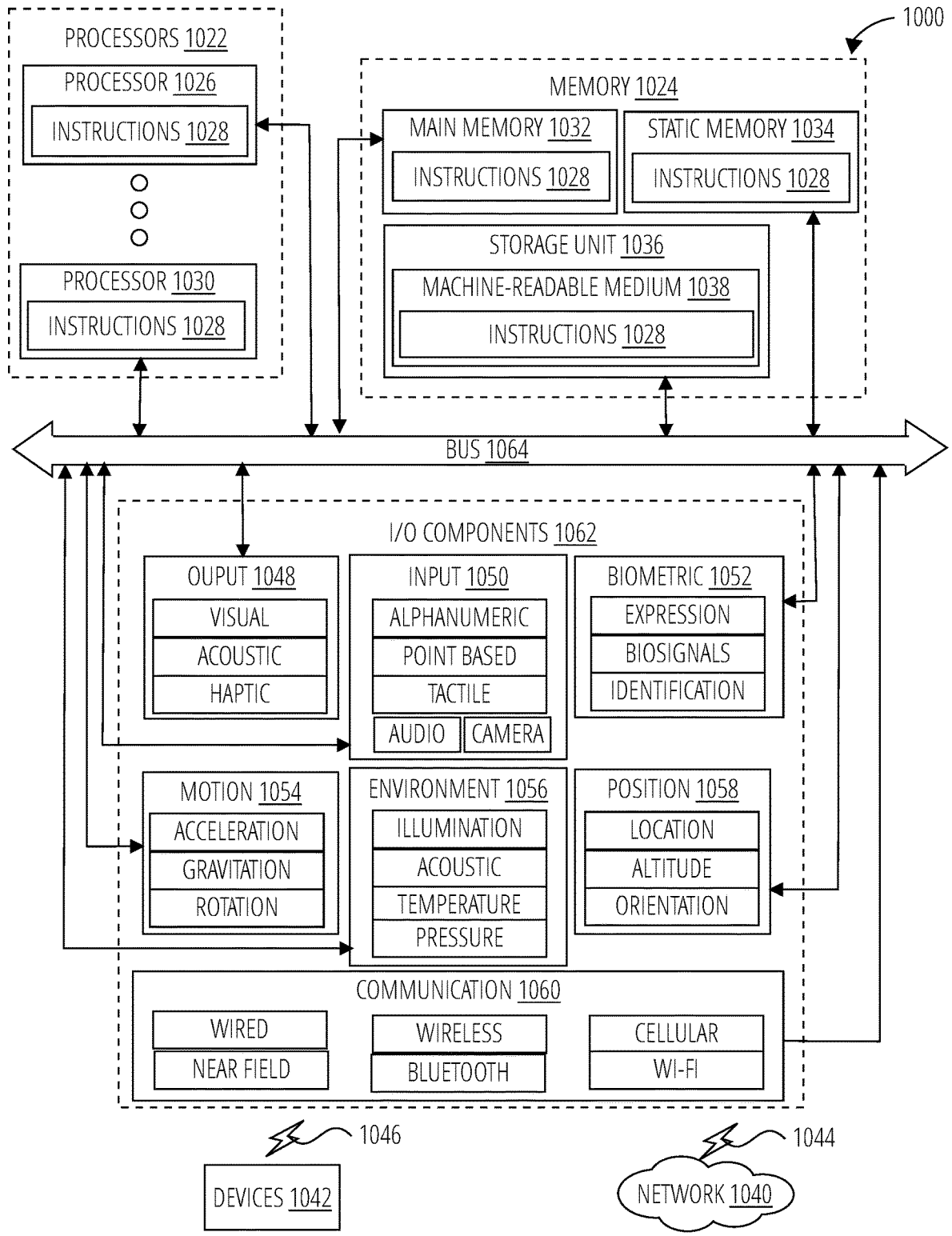
FIG. 10B depicts additional aspects of the computing system 1000 in an example embodiment.

FIG. 10B depicts additional aspects of the computing system 1000 in an example embodiment.

Specifically, FIG. 10B depicts a computing system 1000 comprising instructions 1028 (e.g., a program, an application, an applet, an app, or other executable code) for causing the computing system 1000 to perform any one or more of the operations discussed herein. The instructions 1028 configure a general, non-programmed machine into a particular computing system 1000 programmed to carry out said operations.

In alternative embodiments, the computing system 1000 operates as a standalone device or may be coupled (e.g., networked) to other machines. In a networked deployment, the computing system 1000 may operate in the capacity of a server machine or a client machine in a server-client network environment, or as a peer machine in a peer-to-peer (or distributed) network environment. The computing system 1000 may comprise, but not be limited to, a server computer, a client computer, a personal computer (PC), a tablet computer, a laptop computer, a netbook, a set-top box (STB), a PDA, an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine capable of executing the instructions 1028, sequentially or otherwise, that specify actions to be taken by the computing system 1000. Further, while a single computing system 1000 is depicted, the term "machine" shall also be taken to include a collection of machines that individually or jointly execute the instructions 1028 to perform any one or more of the methodologies or subsets thereof discussed herein.

The computing system 1000 may include processors 1022, memory 1024, and I/O components 1062, which may be configured to communicate with each other such as via one or more bus 1064. In an example embodiment, the processors 1022 (e.g., a Central Processing Unit (CPU), a Reduced Instruction Set Computing (RISC) processor, a Complex Instruction Set Computing (CISC) processor, a Graphics Processing Unit (GPU), a Digital Signal Processor (DSP), an ASIC, a Radio-Frequency Integrated Circuit (RFIC), another processor, or any suitable combination thereof) may include, for example, one or more processor (e.g., processor 1026 and processor 1030) to execute the instructions 1028. The term "processor" is intended to include multi-core processors that may comprise two or more independent processors (sometimes referred to as "cores") that may execute instructions contemporaneously. Although FIG. 10B depicts multiple processors 1022, the computing system 1000 may include a single processor with a single core, a single processor with multiple cores (e.g., a multi-core processor), multiple processors with a single core, multiple processors with multiples cores, or any combination thereof.

The memory 1024 may include one or more of a main memory 1032, a static memory 1034, and a storage unit 1036, each accessible to the processors 1022 such as via the bus 1064. The main memory 1032, the static memory 1034, and storage unit 1036 may be utilized, individually or in combination, to store the instructions 1028 embodying any one or more of the functionality described herein. The instructions 1028 may reside, completely or partially, within the main memory 1032, within the static memory 1034, within a machine-readable medium 1038 within the storage unit 1036, within at least one of the processors 1022 (e.g., within the processor's cache memory), or any suitable combination thereof, during execution thereof by the computing system 1000.

The I/O components 1062 may include a wide variety of components to receive input, provide output, produce output, transmit information, exchange information, capture measurements, and so on. The specific I/O components 1062 that are included in a particular machine will depend on the type of machine. For example, portable machines such as mobile phones will likely include a touch input device or other such input mechanisms, while a headless server machine will likely not include such a touch input device. It will be appreciated that the I/O components 1062 may include many other components that are not shown in FIG. 10B. The I/O components 1062 are grouped according to functionality merely for simplifying the following discussion and the grouping is in no way limiting. In various example embodiments, the I/O components 1062 may include output components 1048 and input components 1050. The output components 1048 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The input components 1050 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), one or more cameras for capturing still images and video, and the like.

In further example embodiments, the I/O components 1062 may include biometric components 1052, motion components 1054, environmental components 1056, or position components 1058, among a wide array of possibilities. For example, the biometric components 1052 may include components to detect expressions (e.g., hand expressions, facial expressions, vocal expressions, body gestures, or eye tracking), measure bio-signals (e.g., blood pressure, heart rate, body temperature, perspiration, or brain waves), identify a person (e.g., voice identification, retinal identification, facial identification, fingerprint identification, or electroencephalogram-based identification), and the like. The motion components 1054 may include acceleration sensor components (e.g., accelerometer), gravitation sensor components, rotation sensor components (e.g., gyroscope), and so forth. The environmental components 1056 may include, for example, illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detection concentrations of hazardous gases for safety or to measure pollutants in the atmosphere), or other components that may provide indications, measurements, or signals corresponding to a surrounding physical environment. The position components 1058 may include location sensor components (e.g., a GPS receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 1062 may include communication components 1060 operable to couple the computing system 1000 to a network 1040 or devices 1042 via a coupling 1044 and a coupling 1046, respectively. For example, the communication components 1060 may include a network interface component or another suitable device to interface with the network 1040. In further examples, the communication components 1060 may include wired communication components, wireless communication components, cellular communication components, Near Field Communication (NFC) components, Bluetooth® components (e.g., Bluetooth® Low Energy), WiFi® components, and other communication components to provide communication via other modalities. The devices 1042 may be another machine or any of a wide variety of peripheral devices (e.g., a peripheral device coupled via a USB).

Moreover, the communication components 1060 may detect identifiers or include components operable to detect identifiers. For example, the communication components 1060 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 1060, such as location via Internet Protocol (IP) geolocation, location via Wi-Fi® signal triangulation, location via detecting an NFC beacon signal that may indicate a particular location, and so forth.

Instruction and Data Storage Medium Embodiments

The various memories (i.e., memory 1024, main memory 1032, static memory 1034, and/or memory of the processors 1022) and/or storage unit 1036 may store one or more sets of instructions and data structures (e.g., software) embodying or utilized by any one or more of the methodologies or functions described herein. These instructions (e.g., the instructions 1028), when executed by processors 1022, cause various operations to implement the disclosed embodiments.

As used herein, the terms "machine-storage medium," "device-storage medium," "computer-storage medium" mean the same thing and may be used interchangeably in this disclosure. The terms refer to a single or multiple storage devices and/or media (e.g., a centralized or distributed database, and/or associated caches and servers) that store executable instructions and/or data. The terms shall accordingly be taken to include, but not be limited to, solid-state memories, and optical and magnetic media, including memory internal or external to processors and internal or external to computer systems. Specific examples of machine-storage media, computer-storage media and/or device-storage media include non-volatile memory, including by way of example semiconductor memory devices, e.g., erasable programmable read-only memory (EPROM), electrically erasable programmable read-only memory (EEPROM), FPGA, and flash memory devices; magnetic disks such as internal hard disks and removable disks; magneto-optical disks; and CD-ROM and DVD-ROM disks. The terms "machine-storage media," "computer-storage media," and "device-storage media" specifically exclude carrier waves, modulated data signals, and other such intangible media, at least some of which are covered under the term "signal medium" discussed below.

Some aspects of the described subject matter may in some embodiments be implemented as computer code or machine-useable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular data structures in memory. The subject matter of this application may be practiced in a variety of system configurations, including hand-held devices, consumer electronics, general-purpose computers, more specialty computing devices, etc. The subject matter may also be practiced in distributed computing environments where tasks are performed by remote-processing devices that are linked through a communications network.

In various example embodiments, one or more portions of the network 1040 may be an ad hoc network, an intranet, an extranet, a VPN, a LAN, a WLAN, a WAN, a WWAN, a MAN, the Internet, a portion of the Internet, a portion of the PSTN, a plain old telephone service (POTS) network, a cellular telephone network, a wireless network, a Wi-Fi® network, another type of network, or a combination of two or more such networks. For example, the network 1040 or a portion of the network 1040 may include a wireless or cellular network, and the coupling 1044 may be a Code Division Multiple Access (CDMA) connection, a Global System for Mobile communications (GSM) connection, or another type of cellular or wireless coupling. In this example, the coupling 1044 may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High Speed Packet Access (HSPA), Worldwide Interoperability for Microwave Access (WiMAX), Long Term Evolution (LTE) standard, others defined by various standard-setting organizations, other long range protocols, or other data transfer technology.

The instructions 1028 and/or data generated by or received and processed by the instructions 1028 may be transmitted or received over the network 1040 using a transmission medium via a network interface device (e.g., a network interface component included in the communication components 1060) and utilizing any one of a number of well-known transfer protocols (e.g., hypertext transfer protocol (HTTP)). Similarly, the instructions 1028 may be transmitted or received using a transmission medium via the coupling 1046 (e.g., a peer-to-peer coupling) to the devices 1042. The terms "transmission medium" and "signal medium" mean the same thing and may be used interchangeably in this disclosure. The terms "transmission medium" and "signal medium" shall be taken to include any intangible medium that is capable of storing, encoding, or carrying the instructions 1028 for execution by the computing system 1000, and/or data generated by execution of the instructions 1028, and/or data to be operated on during execution of the instructions 1028, and includes digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a matter as to encode information in the signal.

Various functional operations described herein may be implemented in logic that is referred to using a noun or noun phrase reflecting said operation or function. For example, an association operation may be carried out by an "associator" or "correlator." Likewise, switching may be carried out by a "switch", selection by a "selector", and so on. "Logic" refers to any set of one or more components configured to implement functionality in a machine. Logic includes machine memories configured with instructions that when executed by a machine processor cause the machine to carry out specified functionality; discrete or integrated circuits configured to carry out the specified functionality; and machine/device/computer storage media configured with instructions that when executed by a machine processor cause the machine to carry out specified functionality. Logic specifically excludes software per se, signal media, and transmission media.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers '0' and '1'.

When used in the claims, the term "or" is used as an inclusive or and not as an exclusive or. For example, the phrase "at least one of x, y, or z" means any one of x, y, and z, as well as any combination thereof.

As used herein, a recitation of "and/or" with respect to two or more elements should be interpreted to mean one element alone or a combination of elements. For example, "element A, element B, and/or element C" may include element A alone, element B alone, element C alone, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, it is contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Having thus described illustrative embodiments in detail, it will be apparent that modifications and variations are possible without departing from the scope of the disclosure as claimed. The scope of disclosed subject matter is not limited to the depicted embodiments but is rather set forth in the following Claims.

What is claimed is:

1. A circuit, comprising:
    a first data latch;
    a second data latch;
    an input for a data signal;
    the first data latch configured to sample a delayed version of the data signal in response to a first control signal;
    the second data latch configured to sample the delayed version of the data signal in response to a run clock signal configured to run for a predefined number of clock cycles subsequent to the first control signal; and
    a third data latch configured to sample either an output signal for the first data latch or an output signal of the second data latch in response to a second control signal received after the predefined number of clock cycles of the run clock signal.

2. The circuit of claim 1, further comprising a controller configured to:
    send the first control signal to the first data latch;
    send an initialization signal to the third data latch after sending the first control signal, the initialization signal configured to reset the third data latch;
    send the run clock signal to the second data latch for a sampling period;
    wherein the run clock signal is substantially simultaneous with the first control signal;
    send the second control signal to the third data latch after a resolution time following the sampling period;
    wherein the second control signal causes the third data latch to send an output signal to synchronous logic.

3. The circuit of claim 2, wherein the resolution time comprises more than two clock cycles of the run clock signal.

4. The circuit of claim 1, wherein the third data latch comprises an SR Latch.

5. The circuit of claim 1, wherein the third data latch is configured receive one of a metastable signal and a narrow pulse with each clock pulse of the run clock signal and register a change in the output signal from one of the first data latch and the second data latch over a series of clock pulses of the run clock signal.

6. The circuit of claim 1, wherein the first data latch comprises a D latch, the second data latch comprises a D flip flop, and the third data latch comprises a D latch.

7. A circuit, comprising:
    an input for a data signal;
    the first sampling circuit configured to sample a delayed version of the data signal in response to an initialization clock signal;
    the second sampling circuit configured to sample the delayed version of the data signal in response to a run clock signal configured to run for a sampling period, the run clock signal being synchronized with the initialization clock signal;
    detection logic configured to detect a change in an output signal of the first sampling circuit or an output signal of the second sampling circuit in response to the run clock signal; and
    a third sampling circuit configured to receive an output signal from the detection logic and store the change in one of the output signal for the first sampling circuit or the output signal for the second sampling circuit.

8. The circuit of claim 7, further comprising logic configured to receive an output signal from the third sampling circuit and pass the output signal to synchronous logic in response to a post clock signal and wherein the data signal comprises a predefined frequency of alternating low logic level data and high logic level data.

9. The circuit of claim 7, further comprising a controller configured to:
    send the initialization clock signal to the first sampling circuit;
    reset the third sampling circuit after sending the initialization clock signal;
    direct the run clock signal to the second sampling circuit for the sampling period; and
    sample the third sampling circuit after the sampling period, the sampling period comprising a resolution time configured to account for metastability of the first sampling circuit and the second sampling circuit.

10. The circuit of claim 9, wherein the resolution time comprises more than two clock cycles of the run clock signal.

11. The circuit of claim 7, wherein the third sampling circuit stores the output signal of the first sampling circuit or the second sampling circuit in response to the change in the output signal coming from the first sampling circuit and the second sampling circuit during the sampling period.

12. A circuit, comprising:
    a first sampling circuit connected to a delay line;
    a second sampling circuit connected to the delay line and a run clock signal;
    the first sampling circuit and the second sampling circuit each configured to register a rising edge of a data signal on the delay line;
    a third sampling circuit connected to the first sampling circuit and the second sampling circuit, the third sampling circuit configured to store a high logic level when the first sampling circuit and the second sampling circuit each output different logic levels; and
    a fourth sampling circuit connected to the third sampling circuit and configured to determine an output signal of the third sampling circuit.

13. The circuit of claim 12, further comprising a controller configured to:
    send a first control signal to the first sampling circuit in sync with the run clock signal to sample the rising edge of the data signal;
    reset the third sampling circuit by way of a second control signal;
    send the run clock signal to the second sampling circuit for a sampling period; and
    send a third control signal to the fourth sampling circuit after a resolution time following the sampling period.

14. The circuit of claim 13, further comprising:
a plurality of buffer circuits, each buffer circuit comprising the first sampling circuit, the second sampling circuit, the third sampling circuit, and the fourth sampling circuit;
an encoder configured to receive a thermometer code from the plurality of buffer circuits and convert the thermometer code to a binary code;
wherein an output signal of each buffer circuit comprises one digit in the thermometer code; and
wherein the controller is further configured to determine a timing margin between the data signal and the run clock signal after the sampling period based on the thermometer code.

15. A system, comprising:
a clock signal;
a delay line configured to carry a data signal, the delay line comprising a set of nodes separated by delay components;
a driver configured to send the data signal on the delay line for a sampling period in response to a change in the clock signal;
a plurality of buffer circuits each coupled to one node of the set of nodes and each buffer circuit configured to output a binary value for one digit of a thermometer code;
an encoder configured to receive the thermometer code from the plurality of buffer circuits and convert the thermometer code to a binary code; and
a controller configured to determine a jitter within the data signal based on the binary code.

16. The system of claim 15, further comprising a calibration circuit configured to adjust a frequency for the clock signal in response to a maximum jitter determined during the sampling period.

17. The system of claim 15, wherein the data signal comprises a rising edge of an analog signal.

18. A circuit, comprising:
an input for a data signal;
a first SR latch comprising a set terminal connected to a first logic gate, an output connected to a first D flip flop, and a reset terminal connected to an inverted version of a first control signal;
a first sampling signal connected to one terminal of the first logic gate and a delayed version of the data signal connected to another terminal of the first logic gate; and
a second control signal configured to sample an output signal of the first D flip flop after a predefined number of clock cycles of the first sampling signal.

19. The circuit of claim 18, further comprising:
a second SR latch comprising a set terminal connected to a second logic gate, an output connected to a second D flip flop, and a reset terminal connected to the first control signal;
a second sampling signal connected to one terminal of the second logic gate and a delayed version of the data signal connected to another terminal of the second logic gate; and
wherein the second control signal is configured to sample an output signal of the second D flip flop after the predefined number of clock cycles of the second sampling signal.

20. The circuit of claim 18, further comprising:
a third logic gate comprising a first input connected to the data signal, a second input connected to an inverted version of the first control signal, and a third input connected to an inverted version of a run clock signal; and
a fourth logic gate comprising a first input connected to the data signal, a second input connected to an inverted version of the first control signal, and a third input connected to the run clock signal.

21. The circuit of claim 18, wherein the first sampling signal and second sampling signal are derived from a third clock signal having twice the frequency of the first sampling signal and the second sampling signal.

* * * * *